(12) United States Patent
Heide

(10) Patent No.: US 8,983,643 B2
(45) Date of Patent: Mar. 17, 2015

(54) METHOD FOR GENERATING AND BUILDING SUPPORT STRUCTURES WITH DEPOSITION-BASED DIGITAL MANUFACTURING SYSTEMS

(75) Inventor: Erik K. Heide, Eden Prairie, MN (US)

(73) Assignee: Stratasys, Inc., Eden Prairie, MN (US)

( * ) Notice: Subject to any disclaimer, the term of this patent is extended or adjusted under 35 U.S.C. 154(b) by 1307 days.

(21) Appl. No.: 12/687,996

(22) Filed: Jan. 15, 2010

(65) Prior Publication Data
US 2011/0178621 A1   Jul. 21, 2011

(51) Int. Cl.
*G05B 19/4097*   (2006.01)
*G06T 11/20*   (2006.01)
*B29C 67/00*   (2006.01)

(52) U.S. Cl.
CPC ......... *B29C 67/0088* (2013.01); *B29C 67/0055* (2013.01); *B29C 67/0092* (2013.01)
USPC ............................................. 700/98; 345/441

(58) Field of Classification Search
None
See application file for complete search history.

(56) References Cited

U.S. PATENT DOCUMENTS

| | | | |
|---|---|---|---|
| 4,397,986 A | 8/1983 | Hornbaker | |
| 4,886,856 A | 12/1989 | Chen et al. | |
| 5,121,329 A | 6/1992 | Crump | |
| 5,131,706 A | 7/1992 | Appleberry | |
| 5,173,220 A | 12/1992 | Reiff et al. | |
| 5,263,130 A * | 11/1993 | Pomerantz et al. | 345/418 |
| 5,303,141 A | 4/1994 | Batchelder et al. | |
| 5,340,433 A | 8/1994 | Crump | |
| 5,402,351 A | 3/1995 | Batchelder et al. | |
| 5,428,717 A * | 6/1995 | Glassner | 345/423 |
| 5,474,719 A | 12/1995 | Fan et al. | |
| 5,503,785 A | 4/1996 | Crump et al. | |
| 5,555,481 A * | 9/1996 | Rock et al. | 419/30 |
| 5,653,925 A | 8/1997 | Batchelder | |
| 5,695,707 A | 12/1997 | Almquist et al. | |
| 5,705,117 A | 1/1998 | O'Connor et al. | |
| 5,764,521 A | 6/1998 | Batchelder et al. | |
| 5,854,748 A * | 12/1998 | Snead et al. | 700/119 |
| 5,866,058 A | 2/1999 | Batchelder et al. | |
| 5,939,008 A | 8/1999 | Comb et al. | |
| 5,999,184 A * | 12/1999 | Smalley et al. | 345/419 |
| 6,022,207 A | 2/2000 | Dahlin et al. | |

(Continued)

FOREIGN PATENT DOCUMENTS

| | | |
|---|---|---|
| EP | 0666164 A2 † | 8/1995 |
| WO | 2006022528 A1 | 3/2006 |

OTHER PUBLICATIONS

Chen, Xiaorui et al. "Polygon Offsetting by Computing Winding Numbers" ASME 2005 International Design Engineering Technical Conferences <me.berkeley.edu/~mcmains/pubs/DAC05OffsetPolygon.pdf> Sep. 2005.*

(Continued)

*Primary Examiner* — Ryan Jarrett
(74) *Attorney, Agent, or Firm* — Brian R. Morrison; Westman, Champlin & Koehler, P.A.

(57) ABSTRACT

A method for generating data for a support structure to be built with a deposition-based digital manufacturing system, the method comprising generating a convex hull polygon based on a boundary polygon of a layer of the support structure, offsetting the convex hull polygon inward, offsetting the boundary polygon outward, and generating an intersection boundary polygon based at least in part on the offset boundary polygon and the offset convex hull polygon.

20 Claims, 15 Drawing Sheets

(56) References Cited

U.S. PATENT DOCUMENTS

| | | | |
|---|---|---|---|
| 6,067,480 A | 5/2000 | Stuffle et al. | |
| 6,070,107 A | 5/2000 | Lombardi et al. | |
| 6,084,980 A * | 7/2000 | Nguyen et al. | 382/154 |
| 6,129,872 A | 10/2000 | Jang | |
| 6,165,406 A | 12/2000 | Jang et al. | |
| 6,175,422 B1 | 1/2001 | Penn et al. | |
| 6,228,923 B1 | 5/2001 | Lombardi et al. | |
| 6,572,807 B1 | 6/2003 | Fong | |
| 6,645,412 B2 | 11/2003 | Priedeman, Jr. | |
| 6,682,684 B1 | 1/2004 | Jamalabad et al. | 264/308 |
| 6,722,872 B1 | 4/2004 | Swanson et al. | |
| 6,790,403 B1 | 9/2004 | Priedeman, Jr. et al. | |
| 6,814,907 B1 | 11/2004 | Comb | |
| 6,822,609 B2 | 11/2004 | Mendolia et al. | |
| 6,879,934 B1 * | 4/2005 | Teig et al. | 702/158 |
| 6,893,590 B1 | 5/2005 | Rigosi et al. | |
| 6,907,307 B2 | 6/2005 | Chen et al. | |
| 6,923,634 B2 | 8/2005 | Swanson et al. | |
| 7,077,638 B2 | 7/2006 | Leyden et al. | |
| 7,122,246 B2 | 10/2006 | Comb et al. | |
| 7,362,326 B2 * | 4/2008 | Su et al. | 345/419 |
| 7,364,686 B2 * | 4/2008 | Kritchman et al. | 264/494 |
| 7,403,833 B2 | 7/2008 | Heide et al. | 700/119 |
| 8,046,097 B2 * | 10/2011 | Hull et al. | 700/119 |
| 8,165,702 B2 * | 4/2012 | Wyatt et al. | 700/97 |
| 2003/0004600 A1 | 1/2003 | Priedeman, Jr. | |
| 2003/0090752 A1 | 5/2003 | Rosenberger et al. | |
| 2004/0012923 A1 | 1/2004 | Chen | |
| 2004/0075196 A1 * | 4/2004 | Leyden et al. | 264/401 |
| 2004/0089983 A1 † | 5/2004 | Jamalabad | |
| 2004/0222561 A1 | 11/2004 | Hopkins | |
| 2005/0004282 A1 | 1/2005 | Priedeman, Jr. et al. | |
| 2005/0103360 A1 | 5/2005 | Tafoya | |
| 2005/0129941 A1 | 6/2005 | Comb et al. | |
| 2005/0131570 A1 | 6/2005 | Jamalabad et al. | |
| 2005/0138885 A1 * | 6/2005 | Rotherroe | 52/720.1 |
| 2005/0173838 A1 | 8/2005 | Priedeman, Jr. et al. | |
| 2007/0003656 A1 | 1/2007 | LaBossiere et al. | |
| 2007/0228590 A1 | 10/2007 | LaBossiere et al. | 264/40.1 |
| 2008/0213419 A1 | 9/2008 | Skubic et al. | |
| 2009/0035405 A1 | 2/2009 | Leavitt | |
| 2009/0173443 A1 | 7/2009 | Kozlak et al. | |
| 2009/0174709 A1 | 7/2009 | Kozlak et al. | |
| 2009/0177309 A1 | 7/2009 | Kozlak | |
| 2009/0263582 A1 | 10/2009 | Batchelder | |
| 2010/0096072 A1 | 4/2010 | Hopkins et al. | |
| 2010/0096485 A1 | 4/2010 | Taatjes et al. | |
| 2010/0096489 A1 | 4/2010 | Taatjes et al. | |
| 2011/0087350 A1 * | 4/2011 | Fogel et al. | 700/98 |

OTHER PUBLICATIONS

Tang, K., Woo, T. (Jun. 1991)."Algorithmic aspects of alternating sum of volumes. Part 1: Data structure and difference operation and Part 2: Nonconvergence and its remedy" Computer-Aided Design 23(5): 357-366, 23(6): 435-443. <http://hdl.handle.net/2027.42/29257> <http://hdl.handle.net/2027.42/29308>.*

Chou, Shuo-Yan, Woo, Tony C., Chen, Lin-Lin, Tang, Kai, Shin, Sung Yong (Jul. 1994)."Scallop hull and its offset." Computer-Aided Design 26(7): 537-542. <http://hdl.handle.net/2027.42/31482>.*

Guerin, Wilfred "Polygon software" RepRap blog <http://blog.reprap.org/2006/03/polygon-software.html> Tuesday, Mar. 14, 2006.*

Cacciola, Fernando "A Survey of Polygon Offseting Strategies" May 2003 <http://fcacciola.50webs.com/Offseting%20Methods.htm> (web.archive.org Jun. 2008).*

Chen, Yong, "Non-uniform offsetting and its applications in laser path planning of stereolithography machine", Proceedings of Solid Freeform Fabrication Symposium, Austin, Texas, USA, 2007.*

Marsan, A.L., et al. "An Assessment of Data Requirements and Data Transfer Formats for Layered manufacturing," NIST Internal Report, NISTIR 6216, Sep. 1998. Available at: <www.mel.nist.gov/msidlibrary/summary/9821.html/>.*

Yang Weidong, "Optimal path planning in Rapid Prototyping based on genetic algorithm," Control and Decision Conference, 2009. CCDC '09. Chinese , vol., No., pp. 5068,5072, Jun. 17-19, 2009 <ieeexplore.ieee.org/stamp/stamp.jsp?tp=&arnumber=5194966&tag=1>.*

International Search Report and Written Opinion dated Jun. 29, 2011 for corresponding International Application No. PCT/US2011/021055, filed Jan. 13, 2011.

Huang et al., "Slice Data Based Support Generation Algorithm for Fused Deposition Modeling", Tsinghua Science and Technology, Tsinghua University Press, Beijing, CN, vol. 14, Jun. 1, 2009, pp. 223-228, XP026352119.

Xiaomao Huang et al., "Sloping wall structure support generation for fused deposition modeling", The International Journal of Advanced Manufacturing Technology, Springer, Berlin, DE, vol. 42, No. 11-12, Aug. 1, 2008, pp. 1074-1081, XP019700665.

E.E. Barton & I. Buchanan, "The Polygon Package," Computer-Aided Design vol. 12 No. 1, pp. 3-11, Jan. 1980, Elsevier Ltd.†

* cited by examiner
† cited by third party

METHOD FOR GENERATING AND BUILDING SUPPORT STRUCTURES WITH DEPOSITION-BASED DIGITAL MANUFACTURING SYSTEMS

BACKGROUND

The present disclosure relates to direct digital manufacturing systems for building three-dimensional (3D) models. In particular, the present invention relates to techniques for generating support structures for use with 3D models in deposition-based digital manufacturing systems.

A deposition-based digital manufacturing system, such as an extrusion-based system or a jetting-based system, is used to build a 3D model from a digital representation of the 3D model in a layer-by-layer manner by extruding a flowable consumable modeling material. For example, in extrusion-based systems, the modeling material is extruded through an extrusion tip carried by an extrusion head, and is deposited as a sequence of roads on a substrate in an x-y plane. The extruded modeling material fuses to previously deposited modeling material, and solidifies upon a drop in temperature. The position of the extrusion head relative to the substrate is then incremented along a z-axis (perpendicular to the x-y plane), and the process is then repeated to form a 3D model resembling the digital representation.

Movement of the extrusion head with respect to the substrate is performed under computer control, in accordance with build data that represents the 3D model. The build data is obtained by initially slicing the digital representation of the 3D model into multiple horizontally sliced layers. Then, for each sliced layer, the host computer generates one or more tool paths for depositing roads of modeling material to form the 3D model.

In fabricating 3D models by depositing layers of a modeling material, supporting layers or structures are typically built underneath overhanging portions or in cavities of objects under construction, which are not supported by the modeling material itself. A support structure may be built utilizing the same deposition techniques by which the modeling material is deposited. The host computer generates additional geometry acting as a support structure for the overhanging or free-space segments of the 3D model being formed. Support material is then deposited from a second nozzle pursuant to the generated geometry during the build process. The support material adheres to the modeling material during fabrication, and is removable from the completed 3D model when the build process is complete.

SUMMARY

A first aspect of the present disclosure is directed to a computer-implemented method for generating data for a support structure to be built with a deposition-based digital manufacturing system. The method includes providing a boundary polygon of a layer of the support structure, generating a convex hull polygon based on the boundary polygon, offsetting the convex hull polygon inward, and offsetting the boundary polygon outward. The method also includes generating an intersection boundary polygon based at least in part on the offset boundary polygon and the offset convex hull polygon.

Another aspect of the present disclosure is directed to a computer-implemented method for generating data for a support structure to be built with a deposition-based digital manufacturing system, where the method includes providing vertices defining a boundary polygon for a layer of the support structure, and generating vertices of a convex hull polygon based on the vertices of the boundary polygon. The method also includes offsetting the vertices of the convex hull polygon inward to provide an offset convex hull polygon, and offsetting the vertices of the boundary polygon outward to provide an offset boundary polygon. The method further includes generating an intersection boundary polygon having vertices, wherein at least a portion of the vertices of the intersection boundary polygon are selected from the group consisting of a vertex that is located at an intersection of the offset boundary polygon and the offset convex hull polygon, a vertex of the offset boundary polygon located inside of the offset convex hull polygon, a vertex of the offset convex hull polygon located inside of the offset boundary polygon, and combinations thereof.

Another aspect of the present disclosure is directed to a method for building a support structure with a deposition-based digital manufacturing system. The method includes generating a convex hull polygon based on a boundary polygon for each of a plurality of layers of the support structure, offsetting the convex hull polygon inward for each of the plurality of layers, and offsetting the boundary polygon outward for each of the plurality of layers. The method also includes generating an intersection boundary polygon for each of the plurality of layers based at least in part on the offset boundary polygon and the offset convex hull, and generating a tool path for each of the plurality of layers based at least in part on the intersection boundary polygon. The method further includes transmitting the generated tool paths to the deposition-based digital manufacturing system, and building the support structure based at least in part on the transmitted tool paths, where the support structure has substantially convex dimensions.

DETAILED DESCRIPTION

The present disclosure is directed to a support structure generation technique that generates support structures for use with 3D models. For example, the support structures may be generated underneath overhanging portions or in cavities of the 3D models under construction, which are not supported by modeling material itself. As discussed below, the technique generates a support structure having convex outer dimensions that reduce in size and complexity in a downward direction along a vertical axis. This reduces the size of the support structure and reduces the distance and angular deflection required by a deposition head to move around the perimeter of the support structure. Additionally, as discussed below, the technique may also reduce the size of interior voids in the support structure, thereby reducing interruptions when bulk filling the interior regions of the support structure (e.g., with a raster fill pattern). These arrangements reduce the overall time required to build the support structure in a deposition-based digital manufacturing system.

Figure 1:
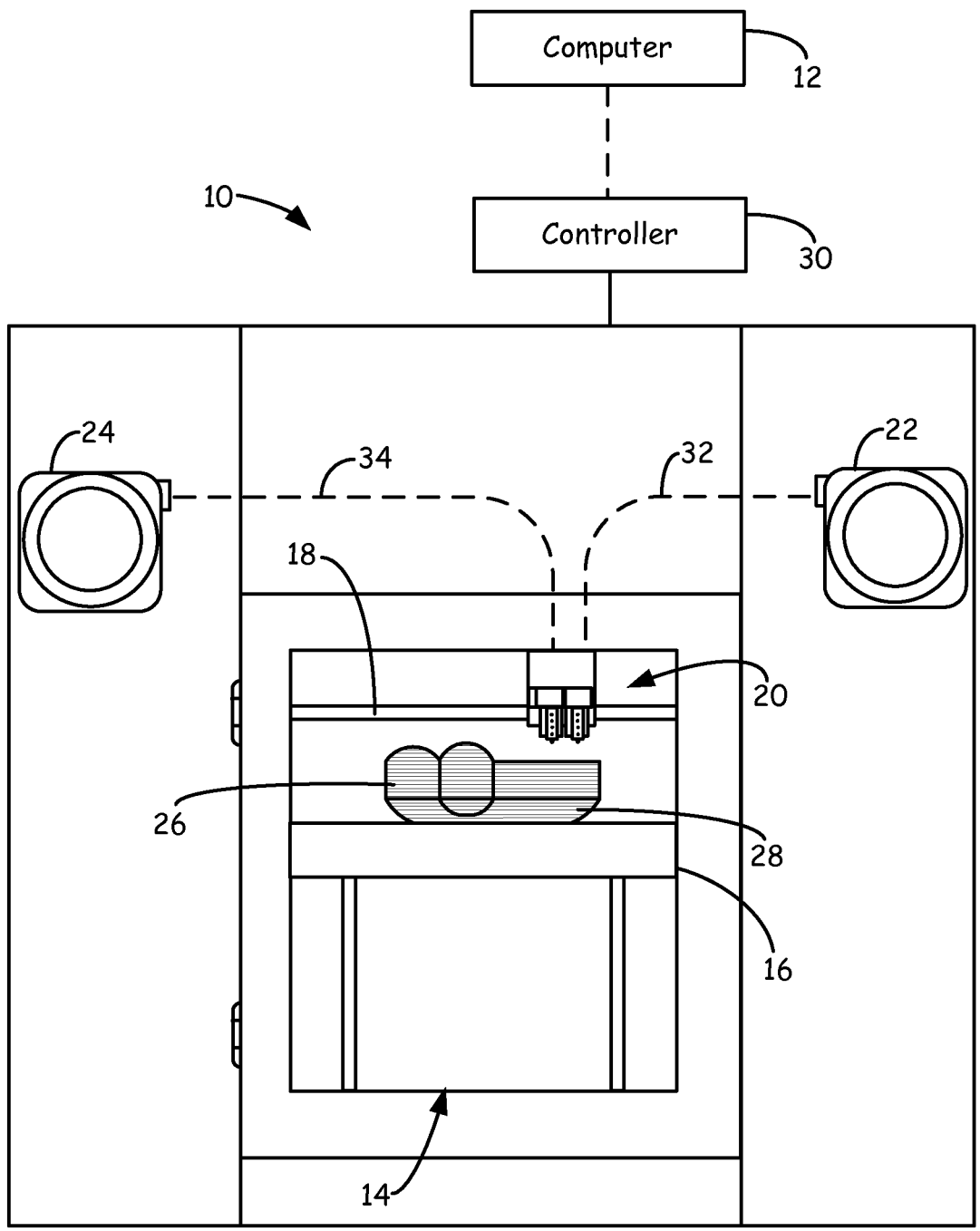
FIG. 1 is a front view of an extrusion-based digital manufacturing system for building 3D models and support structures, where the support structures are generated pursuant to a support structure generation technique of the present disclosure.

FIG. 1 is a front view of system 10 in use with computer 12, where system 10 is deposition-based digital manufacturing system that may be used to build 3D models with support structures generated pursuant to the technique of the present disclosure. Suitable deposition-based digital manufacturing systems include extrusion-based systems, such as fused deposition modeling systems developed by Stratasys, Inc., Eden Prairie, Minn., and jetting-based systems.

Computer 12 is one or more computer-based systems that communicates with system 10, and may be separate from system 10, or alternatively may be an internal component of system 10. As discussed below, computer 12 may generate data, such as tool paths, for building 3D models and support structures in a layer-by-layer manner, where computer 12 may generate the layers of the support structures pursuant to the support structure generation technique of the present disclosure.

In the shown embodiment, system 10 is an extrusion-based system that includes build chamber 14, platen 16, gantry 18, extrusion head 20, and supply sources 22 and 24. Build chamber 14 is an enclosed, heatable environment that contains platen 16, gantry 18, and extrusion head 20 for building a 3D model (referred to as 3D model 26) and a corresponding support structure (referred to as support structure 28). Platen 16 is a platform on which 3D model 26 and support structure 28 are built, and moves along a vertical z-axis based on signals provided from controller 30. As discussed below, controller 30 may direct the motion of platen 16 and extrusion head 20 based on data supplied by computer 12.

Gantry 18 is a guide rail system configured to move extrusion head 20 in a horizontal x-y plane within build chamber 14 based on signals provided from controller 30. The horizontal x-y plane is a plane defined by an x-axis and a y-axis (not shown in FIG. 1), where the x-axis, the y-axis, and the z-axis are orthogonal to each other. In an alternative embodiment, platen 16 may be configured to move in the horizontal x-y plane within build chamber 14, and extrusion head 20 may be configured to move along the z-axis. Other similar arrangements may also be used such that one or both of platen 16 and extrusion head 20 are moveable relative to each other.

Extrusion head 20 is supported by gantry 18 for building 3D model 26 and support structure 28 on platen 16 in a layer-by-layer manner, based on signals provided from controller 30. Accordingly, controller 30 also directs extrusion head 20 to selectively deposit the modeling and support materials based on data supplied by computer 12. In the embodiment shown in FIG. 1, extrusion head 20 is a dual-tip extrusion head configured to deposit modeling and support materials from supply source 22 and supply source 24, respectively.

Examples of suitable extrusion heads for extrusion head 20 include those disclosed in LaBossiere, et al., U.S. Patent Application Publication Nos. 2007/0003656 and 2007/00228590; and Leavitt, U.S. Patent Application Publication No. 2009/0035405. Alternatively, system 10 may include one or more two-stage pump assemblies, such as those disclosed in Batchelder et al., U.S. Pat. No. 5,764,521; and Skubic et al., U.S. Patent Application Publication No. 2008/0213419. Furthermore, system 10 may include a plurality of extrusion heads 18 for depositing modeling and/or support materials.

The modeling material may be provided to extrusion head 20 from supply source 22 through pathway 32. Similarly, the support material may be provided to extrusion head 20 from supply source 24 through pathway 34. System 10 may also include additional drive mechanisms (not shown) configured to assist in feeding the modeling and support materials from supply sources 22 and 24 to extrusion head 20.

The modeling and support materials may be provided to system 10 in a variety of different media. For example, the modeling and support materials may be provided as continuous filaments fed respectively from supply sources 22 and 24, as disclosed in Swanson et al., U.S. Pat. No. 6,923,634; Comb et al., U.S. Pat. No. 7,122,246; and Taatjes et al, U.S. Publication Nos. 2010/0096489 and 2010/0096485. Examples of suitable average diameters for the filaments of the modeling and support materials range from about 1.27 millimeters (about 0.050 inches) to about 2.54 millimeters (about 0.100 inches), with particularly suitable average diameters ranging from about 1.65 millimeters (about 0.065 inches) to about 1.91 millimeters (about 0.075 inches). Alternatively, the modeling and support materials may be provided as other forms of media (e.g., pellets and resins) from other types of storage and delivery components (e.g., supply hoppers and vessels).

Suitable modeling materials for building 3D model 26 include materials having amorphous properties, such as thermoplastic materials, amorphous metallic materials, and combinations thereof. Examples of suitable thermoplastic materials include acrylonitrile-butadiene-styrene (ABS) copolymers, polycarbonates, polysulfones, polyethersulfones, polyphenylsulfones, polyetherimides, amorphous polyamides, modified variations thereof (e.g., ABS-M30 copolymers), polystyrene, and blends thereof. Examples of suitable amorphous metallic materials include those disclosed in U.S. Publication No. 2009/0263582.

Suitable support materials for building support structure 28 include materials having amorphous properties (e.g., thermoplastic materials) and that are desirably removable from the corresponding modeling materials after 3D model 24 and support structure 26 are built. Examples of suitable support materials include water-soluble support materials commercially available under the trade designations "WATERWORKS" and "SOLUBLE SUPPORTS" from Stratasys, Inc., Eden Prairie, Minn.; break-away support materials commercially available under the trade designation "BASS" from Stratasys, Inc., Eden Prairie, Minn., and those disclosed in Crump et al., U.S. Pat. No. 5,503,785; Lombardi et al., U.S. Pat. Nos. 6,070,107 and 6,228,923; Priedeman et al., U.S. Pat. No. 6,790,403; and Hopkins et al., U.S. Publication No. 2010/0096072.

During a build operation, controller 30 directs one or more drive mechanisms (not shown) to intermittently feed the modeling and support materials to extrusion head 20 from supply sources 22 and 24. For each layer, controller 30 then directs gantry 18 to move extrusion head 20 around in the horizontal x-y plane within build chamber 14 based on the data (e.g., tool paths) generated by computer 12. The received modeling and support materials are then deposited onto platen 16 to build the layer of 3D model 26 and support structure 28 using the layer-based additive technique.

The formation of each layer of 3D model 26 and support structure 28 may be performed in an intermittent manner in which the modeling material may initially be deposited to form the layer of 3D model 26. Extrusion head 20 may then be toggled to deposit the support material to form the layer of support structure 28. The reciprocating order of modeling and support materials may alternatively be used. The deposition process may then be performed for each successive layer to build 3D model 26 and support structure 28.

Support structure 28 is desirably deposited to provide vertical support along the z-axis for overhanging regions of the layers of 3D model 26. As shown in FIG. 1, the successive layers of support structure 28 have reduced areas and complexities in the horizontal x-y plane when moving in a downward direction along the vertical z-axis, and provide convex dimensions. The reduced areas correspondingly reduce the distance that extrusion head 20 is required to move around the lateral perimeter of a given layer of support structure 28, and as well as lowering the required total angular deflection of extrusion head 20. The reduce total angular deflection correspondingly allows extrusion head 20 to negotiate corners without needing to slow down. After the build operation is complete, the resulting 3D model 26/support structure 28 may be removed from build chamber 14, and support structure 28 may be removed from 3D model 26.

Figure 2:
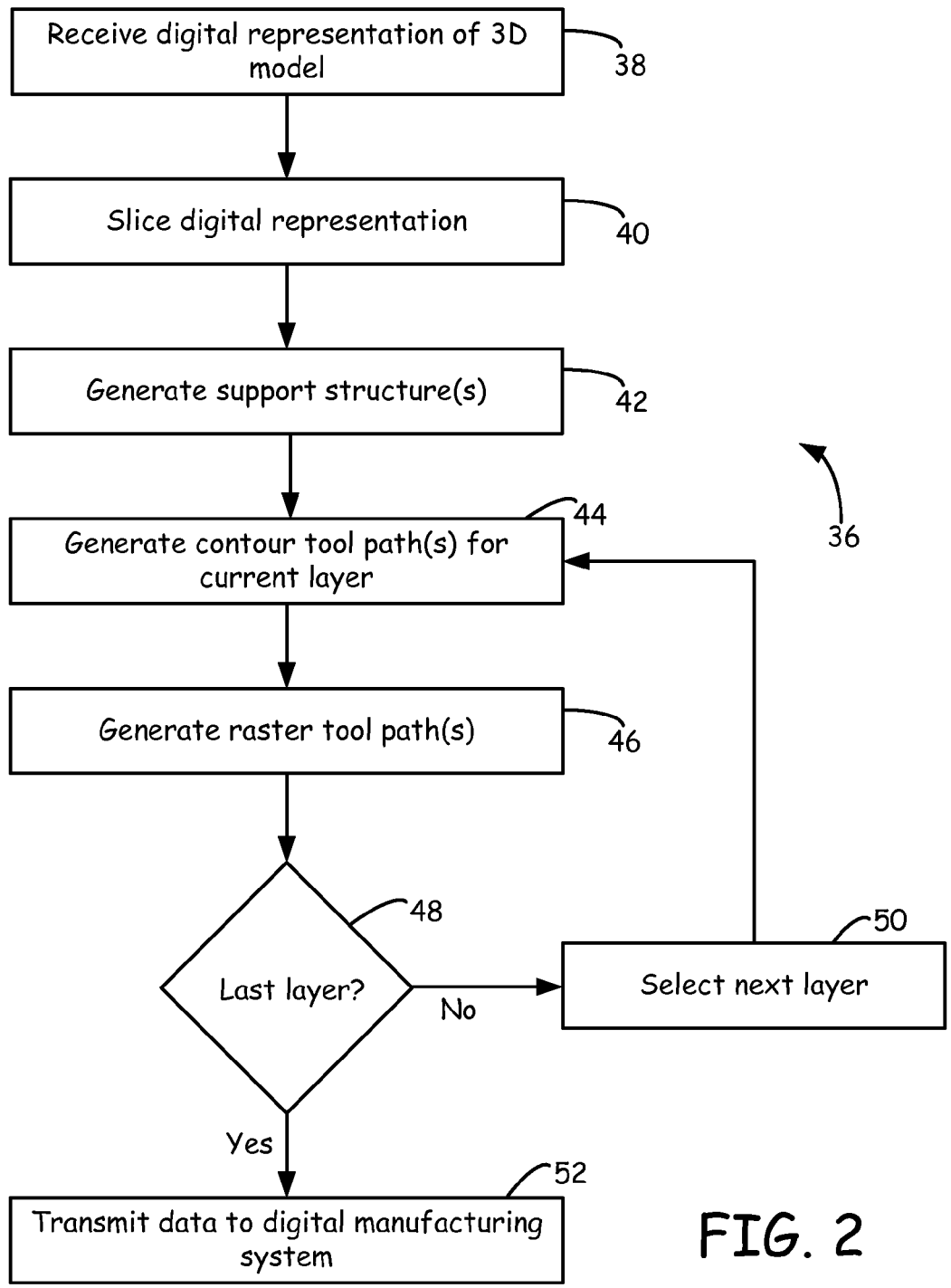
FIG. 2 is a flow diagram of a method for generating data of a 3D model and a corresponding support structure.

FIG. 2 is a flow diagram of method 36 for generating data of a 3D model and corresponding support structure with computer 12, where the generated data may be subsequently used to build the 3D model and support structure in a deposition-based digital manufacturing system (e.g., system 10). Method 36 is an example of a suitable method that incorporates the support structure generation technique of the present disclosure for generating support structures having convex dimensions. The following discussion of method 36 is made with reference to 3D model 26 and support structure 28 (shown in FIG. 1). However, method 36 is applicable for building 3D models and corresponding support structures having a variety of different geometries, and with a variety of different deposition-based digital manufacturing systems.

As shown, method 36 includes steps 38-52, and initially involves receiving a digital representation of 3D model 26 at computer 12 (step 38). Upon receipt of the digital representation of 3D model 26, computer 12 may reorient the digital representation and slice the digital representation into multiple layers (step 40). As discussed below, computer 12 may then generate one or more layers of support structure 28, where at least a portion of the layers of support structure 28 are generated pursuant to the support structure generation technique of the present disclosure (step 42).

In some embodiments, one or more of the layers of support structure 28 may have a dense fill pattern and others of the layers may have a sparse fill pattern. The dense fill pattern refers to an interior fill of a given layer in which the raster-fill pattern desirably reduces the number of voids within the layer. In comparison, the sparse fill pattern refers to an interior fill of a given layer in which the raster-fill pattern desirably creates voids within the layer to reduce the amount of support material required to build the given layer. For example, the top-most layers of support structure 28 (e.g., the top five layers) may exhibit a dense fill arrangement to provide a suitable support surface for the overhanging layer of 3D model 26. Below these dense-filled layers, support structure 28 may include sparse-filled layers. As discussed below, the support structure generation technique of the present disclosure is desirably applied to the layers of support structure 28 having one or more sparse fill patterns. However, in alternative embodiments, the support structure generation technique may be applied to any layer of a support structure (e.g., any layer of support structure 28).

After support structure 28 is generated, computer 12 may select a first layer of the sliced layers and generate one or more contour tool paths based on the boundary or boundaries of the layer (step 44). In some examples, a given layer may include multiple boundaries for building multiple 3D models and support structures, and/or may include an outer boundary and an inner boundary for a single 3D model and/or support structure (e.g., having a hollow interior cavity).

The contour tool paths may be generated by computer 12 based on a road width, which is a predicted width of a deposited road of the modeling or support material, and may depend on a variety of factors, such as material properties, the type of deposition-based digital manufacturing system used, deposition conditions, deposition tip dimensions, and the like. Suitable roads widths for use with system 10 range from about 250 micrometers (about 10 mils) to about 1,020 micrometers (about 40 mils), with particularly suitable road widths ranging from about 380 micrometers (about 15 mils) to about 760 micrometers (about 30 mils).

Computer 12 may then generate additional tool paths (e.g., raster paths) to bulk fill the interior region within the contour tool paths (step 46), where the additional tool paths may also be based on the road width. When the layer is completed, computer 12 may then determine whether the current layer is the last of the sliced layers (step 48). In the current example, layer 36 is not the last layer. As such, computer 12 may select the next layer (step 50) and repeat steps 74-82 until the last layer is completed. When the last layer is completed, computer 12 may transmit the resulting data to system 10 for building 3D model 26 and support structure 28 (step 54). During the build operation, extrusion head 20 may then follow the patterns of the tool paths for each layer.

Figure 3:
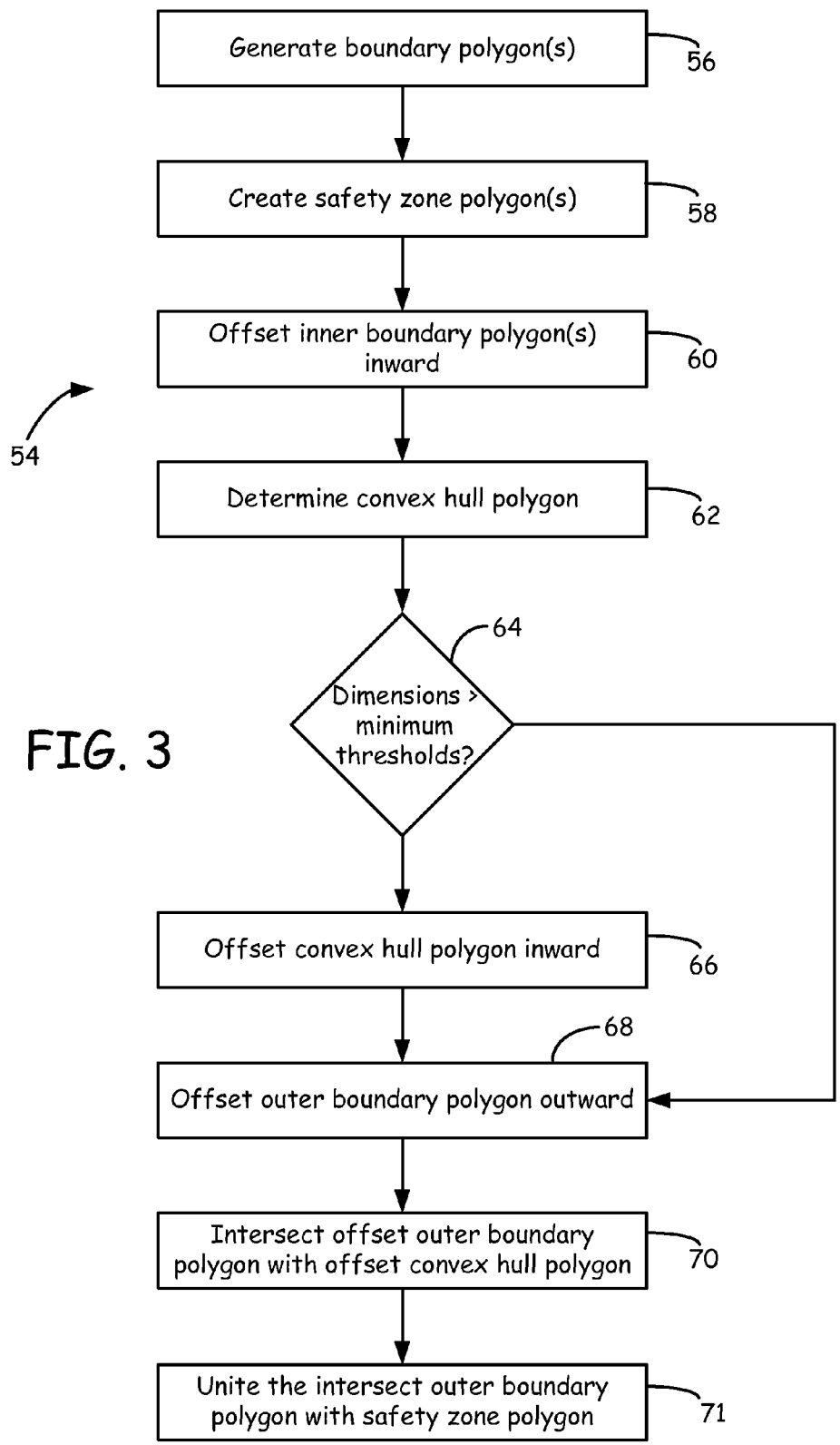
FIG. 3 is a flow diagram of a method for generating a layer of the support structure pursuant to the support structure generation technique of the present disclosure.

FIG. 3 is a flow diagram of method 54 for generating a layer of a support structure (e.g., support structure 28) pursuant to step 42 of method 36 (shown in FIG. 2), and which is based on the support structure generation technique of the present disclosure. The following discussion of method 54 is also made with reference to 3D model 26 and support structure 28 (shown in FIG. 1). However, method 54 is also applicable for building 3D models and corresponding support structures having a variety of different geometries.

As shown in FIG. 3, method 54 includes steps 56-71, and initially involves generating (or otherwise providing) one or more polygons that initially define the inner and/or outer boundaries of a given layer of support structure 28 (step 56). The inner and outer boundary polygons are each defined by a plurality of vertices that interconnect linear segments, desirably in a closed-polygon arrangement.

Computer 12 may then generate a safety zone polygon around each interior boundary polygon, if any, to reduce the risk of intersecting polygons of the inner and outer boundaries, as discussed below (step 58). In one embodiment, each safety zone polygon may be generated as an outward offset from the vertices of an inner boundary polygon based on a "buffer width distance". For example, the buffer width distance may be equal to a desired lateral air gap between 3D model 26 and support structure 28, and may also be increased by a factor of the road width of support structure 28 (e.g., twice the road width of support structure 28).

The vertices of the interior boundary polygon(s), if any, may also be offset inward by a "first vertex travel distance" (step 60), where the first vertex travel distance is a maximum distance the vertices of the interior boundary polygon(s) may be moved inward. This value desirably balances the ability to decrease the dimensions of interior void regions of support structure 28, while also providing suitable vertical support for above-overhanging layers. Accordingly, for slice heights of about 250 micrometers (about 0.01 inches), examples of suitable values for the first vertex travel distance include up to about 50% of the road width used to build support structure 28 with system 10, with particularly suitable values ranging from about 15% to about 45% of the road width, and with even more particularly suitable values ranging from about 25% to about 40% of the road width. In some embodiment, the first vertex travel distance may be reduced for slice heights less than about 250 micrometers (about 0.01 inches).

Computer 12 may also then determine a convex hull polygon for the outer boundary polygon (step 62). The convex hull polygon is the boundary of the minimal convex set containing a given non-empty finite set of points in the horizontal x-y plane for the outer boundary polygon. As discussed below, the convex hull polygon is beneficial for reducing the size and complexity of support structure 28.

Computer 12 may also determine whether the dimensions of the current layer, as defined by the outer boundary polygon, are greater than one or more minimum thresholds (step 64). For example, in step 64 of method 54, computer 12 may determine a characteristic width of the outer boundary to identify any thin-wall regions of the outer boundary polygon. Computer 12 may compare the characteristic width to a "minimum width threshold". The use of the minimum width threshold is beneficial to prevent the given layer of support structure 28 from becoming too thin to be stable. Examples of suitable values for the minimum width threshold range from about 500 micrometers (about 0.02 inches) to about 2,500 micrometers (about 0.1 inches), with particularly suitable values ranging from about 500 micrometers (about 0.02 inches) to about 1,300 micrometers (about 0.05 inches). In some embodiments, the minimum width threshold may also scale with the vertical height of 3D model 26 if the vertical height exceeds a particular level (e.g., greater than about 300 millimeters (about 12 inches)).

Additionally, computer 12 may compare the area defined by the outer boundary polygon to a "minimum area threshold". For example, the minimum threshold area may be determined as the difference between the area defined by the outer boundary polygon and the combined areas defined by the offset inner boundary polygon(s). The use of the minimum area threshold is beneficial to ensure that a minimum horizontal area is retained for supporting above layers. Examples of suitable values for the minimum area threshold range from about 130 square millimeters (about 0.2 square inches) to about 650 square millimeters (about 1.0 square inch), with particularly suitable values ranging from about 130 square millimeters (about 0.2 square inches) to about 320 square millimeters (about 0.5 square inches). In some embodiments, the minimum area threshold may also scale with the area of a two-dimensional, horizontal bounding box of 3D model 26 if the area of the bounding box exceeds a particular level (e.g., greater than about 650 square centimeters (about 100 square inches)).

As further shown in FIG. 3, if one or more of the dimensions do not exceed their respective minimum thresholds, computer 12 may then omit step 66 of method 54, and may proceed directly to step 68. Alternatively, if the dimensions do exceed their respective minimum thresholds, then computer 12 may offset the convex hull polygon inward by a "second vertex travel distance" (step 66), which defines a maximum distance the vertices of the outer boundary may be moved inward. This value desirably balances the ability to decrease the dimensions of the outer boundary polygon with the ability to provide suitable vertical support for above-overhanging layers. Accordingly, for slice heights of about 250 micrometers (about 0.01 inches), examples of suitable values for the second vertex travel distance include those discussed above for the first vertex travel distance. In some embodiments, the second vertex travel distance may also be reduced for slice heights less than about 250 micrometers (about 0.01 inches). In additional embodiments, the first vertex travel distance and the second vertex travel distance may be the same or substantially the same values.

Computer 12 may then offset the vertices of the outer boundary polygon outward by a "third vertex travel distance" (step 68), where the third vertex travel distance is desirably the same or substantially the same as the second vertex travel distance. Offsetting the vertices of the outer boundary polygon outward in this step incrementally evolves the original outer boundary polygon toward the offset convex hull. It has the effect of making non-convex regions of the outer boundary polygon move toward the offset convex hull, or even removing them entirely, such as in the case of long, narrow cutouts.

Computer 12 may then intersect the region of the offset outer boundary polygon with the region of the offset convex hull polygon (step 70). As discussed below, intersecting the offset outer boundary polygon with the offset convex hull polygon in this manner results in a new outer boundary polygon that has its maximum vertices defined by the offset hull convex polygon and its minimum vertices defined by the offset outer boundary polygon, and is referred to as an intersection outer boundary polygon.

Accordingly, as discussed below, at least a portion of the vertices of the resulting intersection outer boundary polygon may include (1) one or more vertices created at the intersections of the offset convex hull polygon and the offset outer boundary polygon, (2) one or more vertices of the offset convex hull polygon that are located inside of the offset outer boundary polygon, (3) one or more vertices of the offset outer boundary polygon that are located inside of the offset convex hull polygon, and combinations thereof. This allows segments of the offset outer boundary polygon, located inside the offset convex hull polygon, to move outward the third vertex travel distance, thereby reducing the complexity of the successive layers of support structure 28.

In some situations, the polygons of the offset outer boundary and the offset convex hull may not necessarily intersect. However, the regions defined by the offset outer boundary polygon and the offset convex hull polygon will intersect. For example, in situations where the original outer boundary polygon already exhibits convex dimensions, the determined convex hull (from step 62) may be co-linear with outer boundary polygon. Thus, the inward offsetting of the convex hull polygon and the outward offsetting of the outer boundary polygon, respectively pursuant to steps 66 and 68, will result in the offset convex full polygon being entirely inside the region of the offset outer boundary polygon. In these example situations, the vertices of the intersection outer boundary polygon will be based entirely on (2) the vertices of the offset convex hull polygon that are located inside of the offset outer boundary polygon, subject to the safety zone polygon, as discussed below.

Computer 12 may also unite the vertices of the intersection outer boundary polygon may with the safety zone polygon (step 71). This results in the intersection outer boundary polygon having its minimum vertices also defined at least in part by the safety zone polygon, as is referred to as a united outer boundary polygon. As discussed above, this incrementally evolves the original outer boundary polygon toward the offset convex hull. Accordingly, as discussed below, at least one of the vertices of the united outer boundary polygon may also include (1) one or more vertices created at the intersections of the offset outer boundary polygon and the safety zone polygon, (2) one or more vertices of the safety zone polygon located inside of the offset outer boundary polygon, and combinations thereof.

After step 71 of method 54 is completed, computer 12 may then generate contour tool paths based on the united outer boundary polygon and on any offset inner polygon(s), and may fill interior region(s) with one or more raster tool paths (e.g., sparse-fill raster tool paths), pursuant to steps 44 and 46 of method 36 (shown in FIG. 2). In some embodiments that include multiple support structures, method 54 may be applied to each support structure, where adjacent support structures may also join together due to the incremental evolution of the convex dimensions. Method 54 may then be repeated for each subsequent layer downward along the vertical z-axis, where each subsequently lower layer is generated to support the previously generated layer, as modified by method 54.

While steps 56-70 of method 54 are shown and described in a particular order, the various steps of method 54 may alternatively be performed in a variety of different orders so long as the reordering of a particular step does not prevent the operation of a subsequent step. Furthermore, an alternative embodiment, steps 58 and 71 may be omitted, such that computer 12 may then generate contour tool paths based on the intersection outer boundary polygon (from step 70) and on any offset inner polygon(s). Moreover, in additional alternative embodiments, such as in embodiments in which support structure 28 does not include interior void regions, steps 58, 60, and 71 may be omitted. Accordingly, computer 12 may generate the contour tool paths based on the united outer boundary polygon and/or on the intersection outer boundary polygon, in addition to any offset inner polygon(s), such that the contour tool path(s) are generated based at least in part on the intersection outer boundary polygon.

Figure 4A:
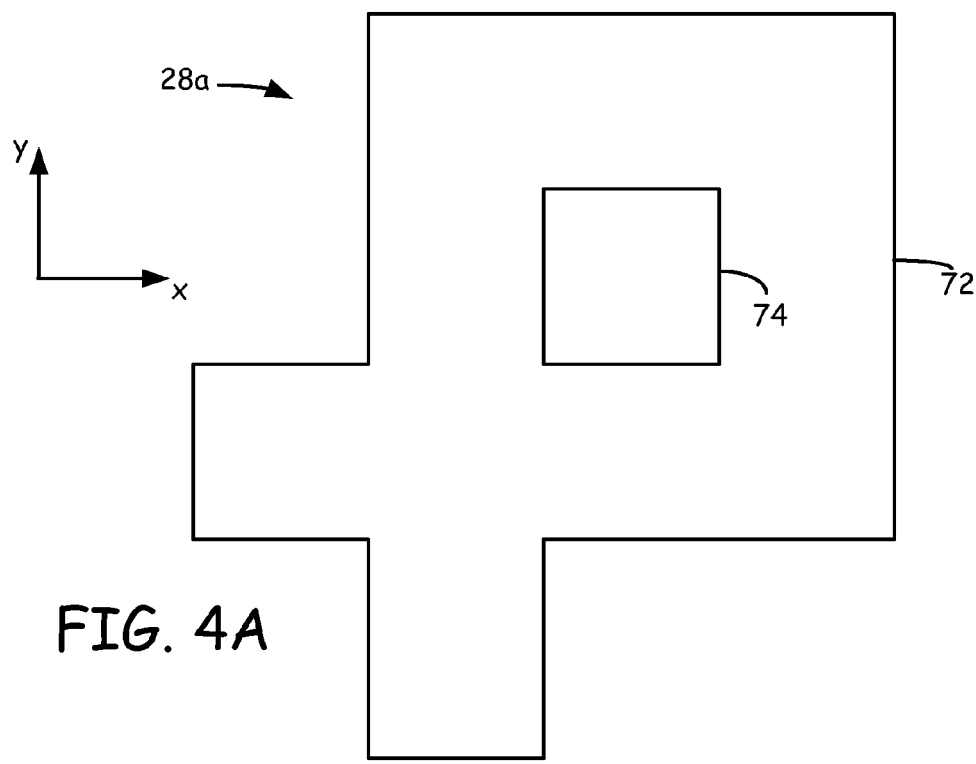
FIGS. 4A-4H are top views of a first layer of the support structure, illustrating an application of the method shown in FIG. 3.

FIGS. 4A-4H, 5A-5H, and 6A-6H illustrate the application of method 54 (shown in FIG. 3) to layers 28a-28c of support structure 28, where layer 28a (shown in FIGS. 4A-4H) is a top-most, sparse filled layer of support structure 28, layer 28b (shown in FIGS. 5A-5H) is the layer directly below layer 28a, and layer 28c (shown in FIGS. 6A-6H) is the layer directly below layer 28b. As shown in FIG. 4A, layer 28a includes a pair of polygons that define outer boundary 72 and inner boundary 74, where outer boundary 72 and inner boundary 74 are each polygons defined by a plurality of segment-interconnected vertices. Accordingly, pursuant to step 56 of method 54, computer 12 may generate outer boundary 72 and inner boundary 74 based on one or more conventional support generation algorithms.

Figure 4B:
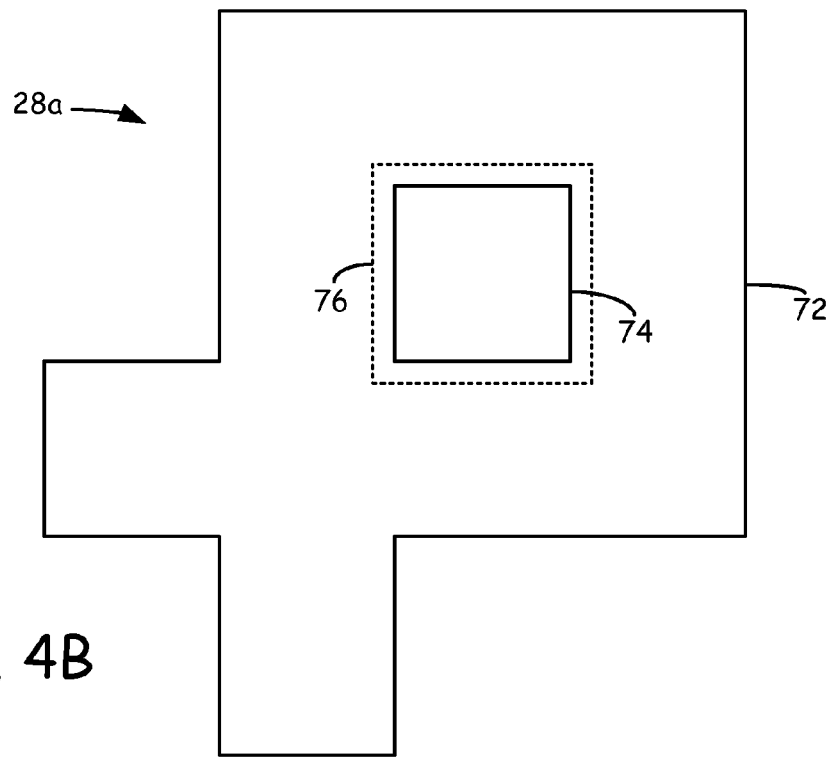

As shown in FIG. 4B, pursuant to step 58, computer 12 may then generate safety zone 76 around inner boundary 74, where safety zone 76 is an additional polygon generated as an outward offset from the vertices of inner boundary 74 based on the buffer width distance. As used herein, directional terms such as "inward", "outward", and the like, refer to directions relative to a polygon. For example, a direction that is offset outward from a polygon refers to an offset that is outside of and away from the polygon, such as safety zone 76 being at an outward offset from inner boundary 74, as shown in FIG. 4B. Similarly, a direction that is offset inward from a polygon refers to an offset that is inside of and away from the polygon.

Figure 4C:
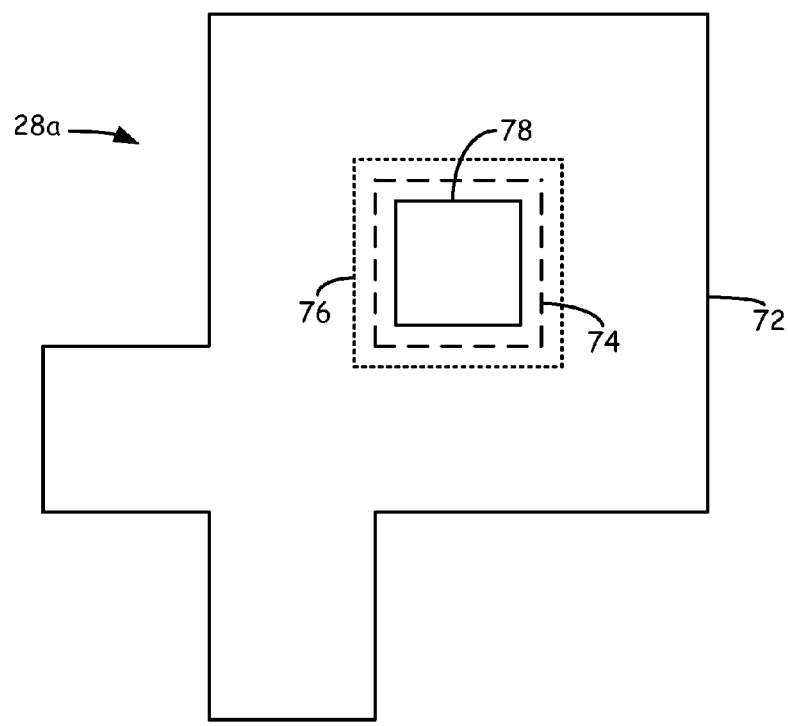

As shown in FIG. 4C, pursuant to step 60, computer 12 may offset the vertices of inner boundary 74 inward by the first vertex travel distance to attain the polygon of offset inner boundary 78, and the originally generated inner boundary 74 (shown in FIG. 4C with broken lines) may be discarded.

Figure 4D:
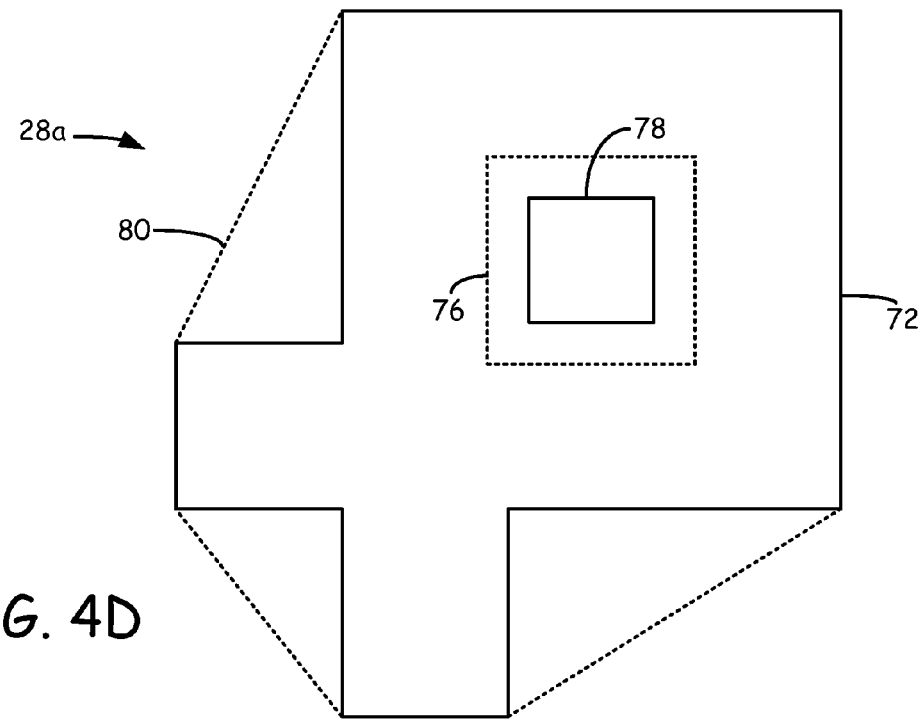

As shown in FIG. 4D, pursuant to step 62, computer 12 may then generate convex hull 80, which, as shown, is a polygon of the minimal convex set containing a given non-empty finite set of points in the horizontal x-y plane of outer boundary 72. Computer 12 may then determine whether the dimensions of outer boundary 72 are greater than one or more minimum thresholds, pursuant to step 64. In the current example, the characteristic width are respectively greater than the minimum width threshold and the minimum area threshold.

Figure 4E:
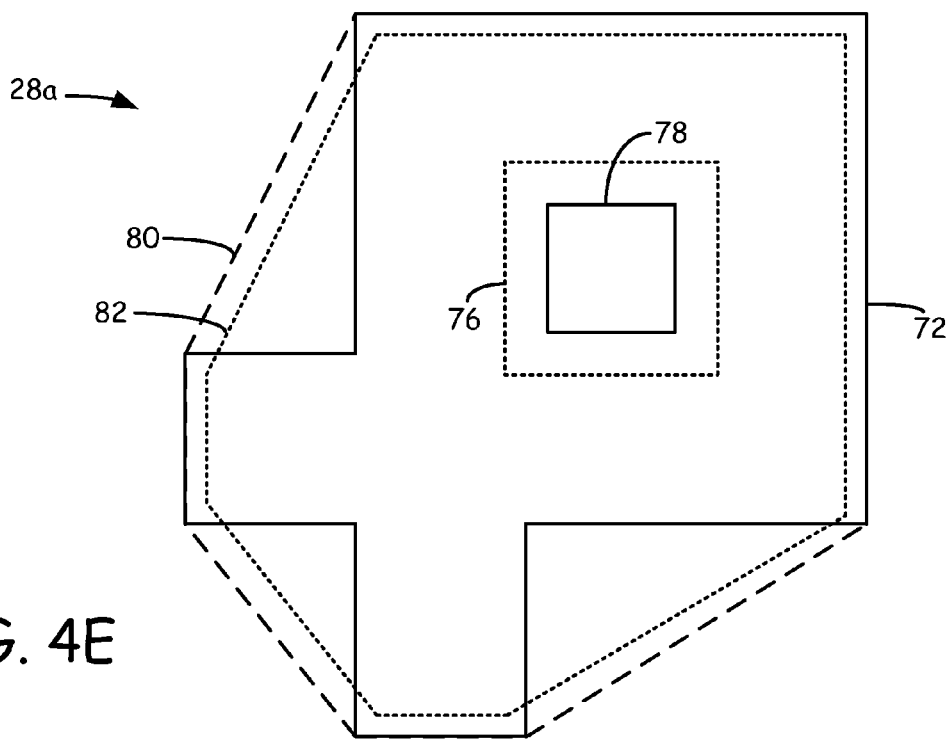
Figure 4F:
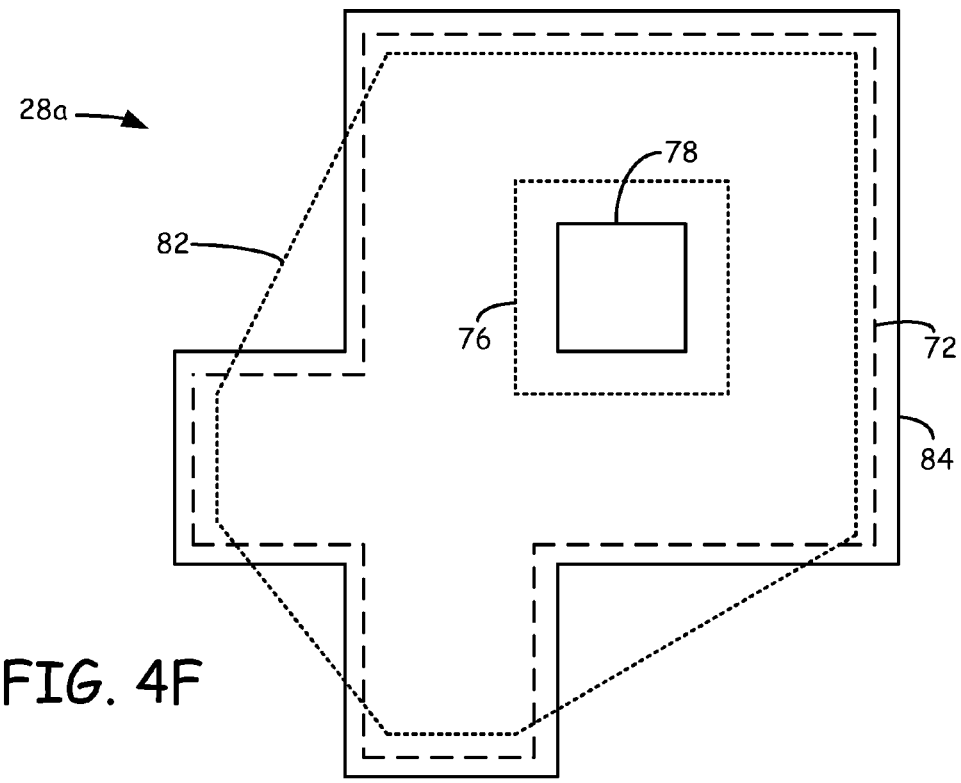

Accordingly, as shown in FIG. 4E, computer 12 may then proceed to step 66 and may offset convex hull 80 inward by the second vertex travel distance, where, as discussed above, is a maximum distance that the vertices of outer boundary 72 may be moved inward. This provides the polygon of offset convex hull 82, and the originally generated convex hull 80 (shown in FIG. 4E with broken lines) may be discarded. As shown in FIG. 4F, computer 12 may then proceed to step 68 and may offset outer boundary 72 outward by the third vertex travel distance to attain the polygon of offset outer boundary 84. The originally generated outer boundary 72 (shown in FIG. 4F with broken lines) may correspondingly be discarded. While offset outer boundary 84 is illustrated in FIG. 4E with sharp corners at its vertices, in some embodiments, the outward offsetting of the vertices of outer boundary 72 may create rounded corners, where the locus of the vertex points may be equidistant from original polygon (i.e., from outer boundary 72).

Figure 4G:
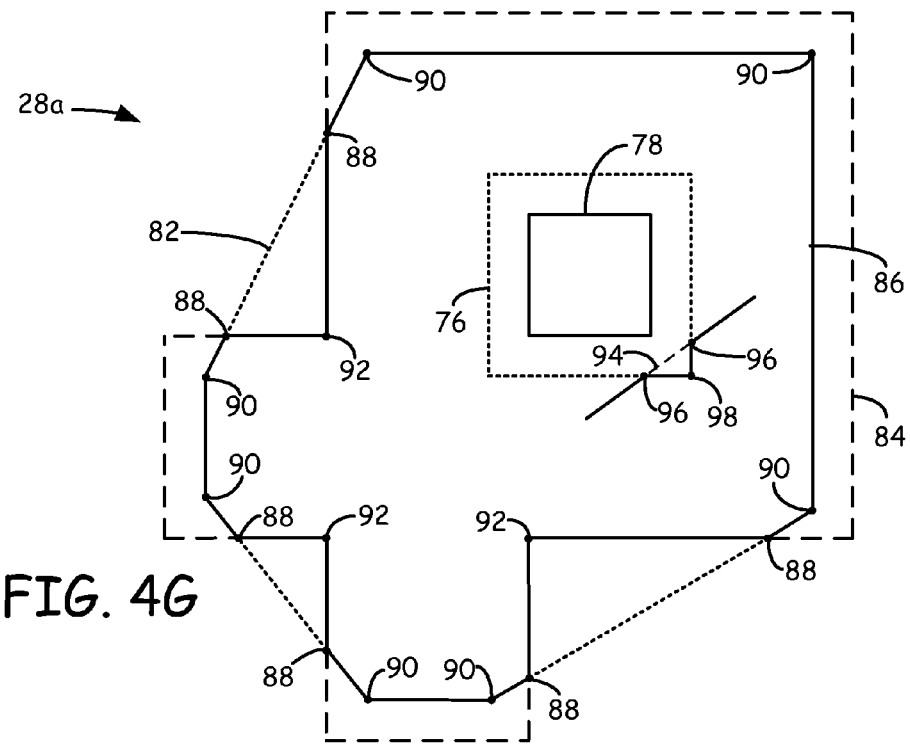

As shown in FIG. 4G, pursuant to step 70, computer 12 may intersect offset outer boundary 84 with offset convex hull 82 and safety zone 76 to attain the polygon of intersection outer boundary 86. The offset outer boundary 84 (shown in FIG. 4G with broken lines) may correspondingly be discarded. In the shown example, offset outer boundary 84 may intersect with offset convex hull 82 such that intersection outer boundary 86 has its maximum vertices defined by the offset convex hull 82 and its minimum vertices defined by offset outer boundary 84.

Accordingly, the vertices of intersection outer boundary 86 include (1) vertices 88 created at the intersections of offset convex hull 82 and offset outer boundary 84, (2) the vertices 90 of offset convex hull 82 that are located inside of offset outer boundary 84, and (3) the vertices 92 of offset outer boundary 84 that are located inside of offset convex hull 82. As discussed above, this allows the segments of offset outer boundary 84 located inside offset convex hull 82, to move outward, thereby reducing the complexity of the successive layers of support structure 28.

This intersecting of offset convex hull 82 and offset outer boundary 84 may also be visualized by identifying the points along offset convex hull 82 where offset outer boundary 84 intersects offset convex hull 82, and eliminating any segment portions of offset outer boundary 84 that extend outside of offset convex hull 82 beyond the intersection points, and also eliminating any segment portions of offset convex hull 82 that extend inside of offset outer boundary 84 beyond the intersection points.

In current example, outer boundary 72 (shown in FIGS. 4A-4F) is not co-linear with convex hull 80 (shown in FIGS. 4D and 4E). As such, as shown in FIG. 4G, the polygons of offset convex hull 82 and offset outer boundary 84 intersect at vertices 88. Alternatively, in an example in which outer boundary 72 was co-linear with convex hull 80, offset convex hull 82 would be located entirely within offset outer boundary 84. As discussed above, in this alternative example, the vertices of intersection outer boundary 86 would be derived entirely from vertices 90 of offset convex hull 82. Accordingly, method 54 is suitable for continuing to modify layers in which the outer boundaries of the layers already exhibit convex dimensions.

As further shown in FIG. 4G, in the current example, offset outer boundary 84 does not overlap safety zone 76. As such, pursuant to step 71 of method 54, the resulting united outer boundary has the same segments and vertices as intersection outer boundary 86 (i.e., there are no segments of offset outer boundary 84 that unite with safety zone 76). Alternatively, in an example in which intersection outer boundary 86 included segment 94 extending inside of safety zone 76, the resulting united outer boundary from step 71 of method 54 would then also have vertices 96 created at the intersections of intersection outer boundary 86 and safety zone 76, and vertex 98 of safety zone 76 that is located outside of intersection outer boundary 86. Accordingly, the resulting polygon of the united outer boundary would include the portions of segment 94 extending toward vertices 96, and the segments between vertices 96 and 98. As discussed above, the use of safety zone 76 in this manner maintains a minimum distance between offset inner boundary 78 and intersection outer boundary 86, where, in the current example, the minimum distance may be the sum of the buffer width distance and the first vertex travel distance.

Figure 4H:
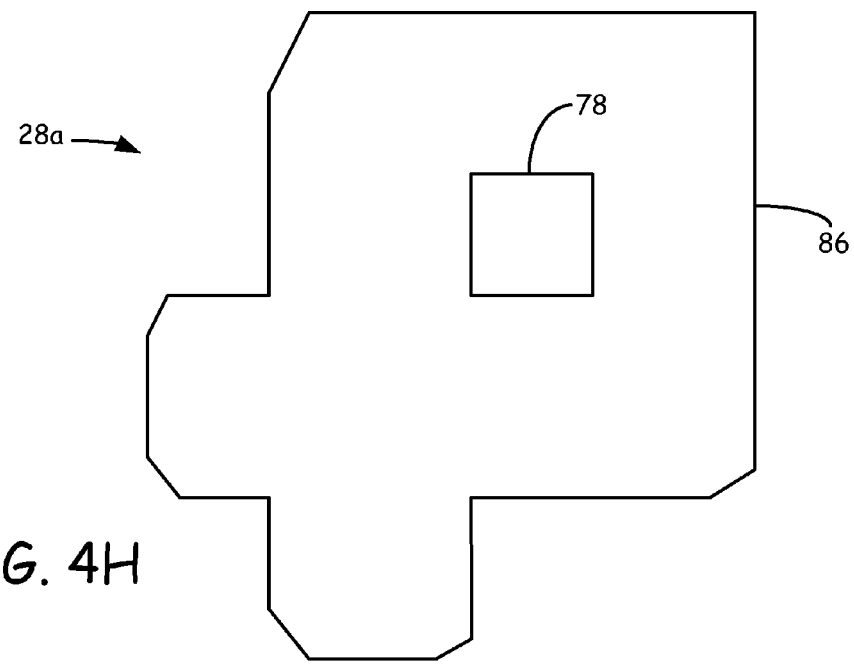
Figure 5A:
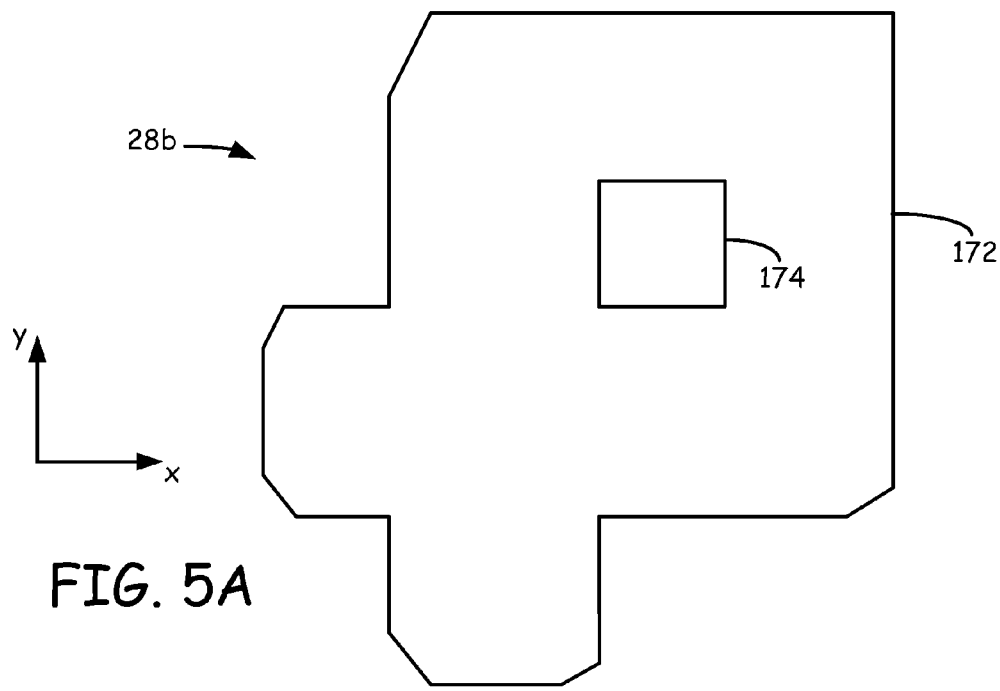
FIGS. 5A-5H are top views of a second layer of the support structure, further illustrating the application of the method shown in FIG. 3, where the second layer is located below the first layer shown in FIGS. 4A-4H.
Figure 5B:
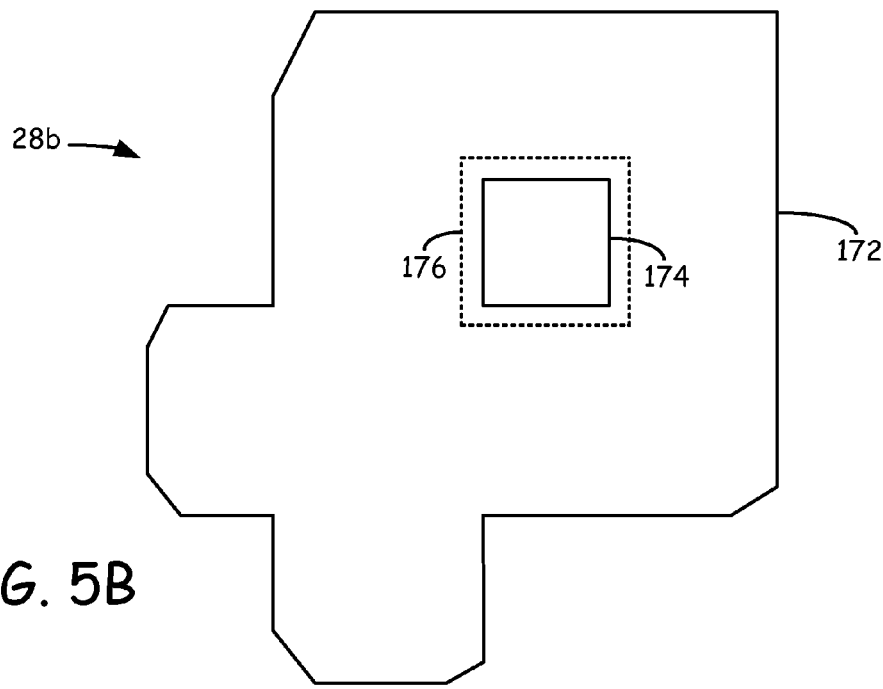
Figure 5C:
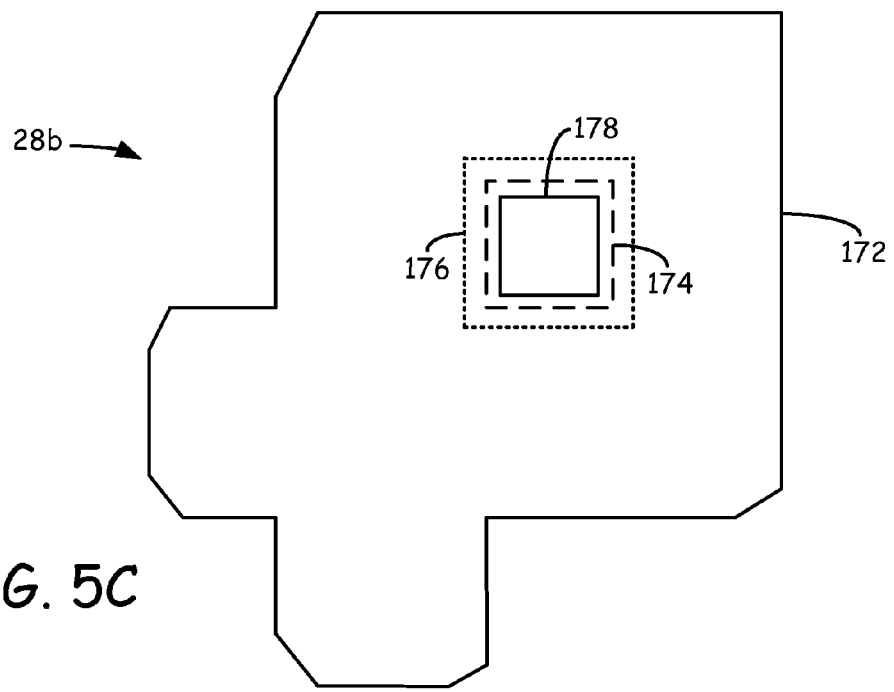
Figure 5D:
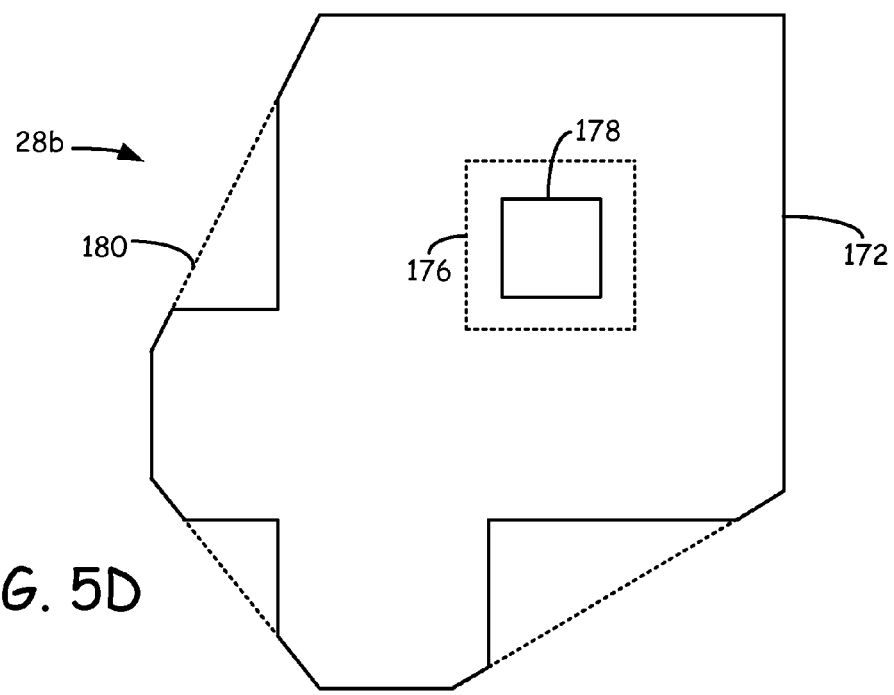
Figure 5E:
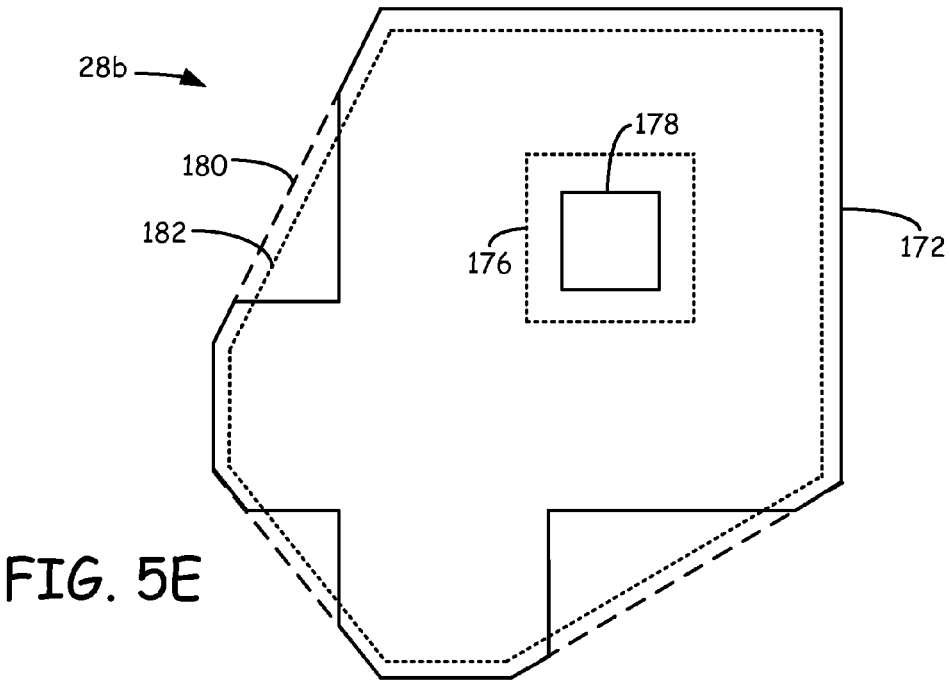
Figure 5F:
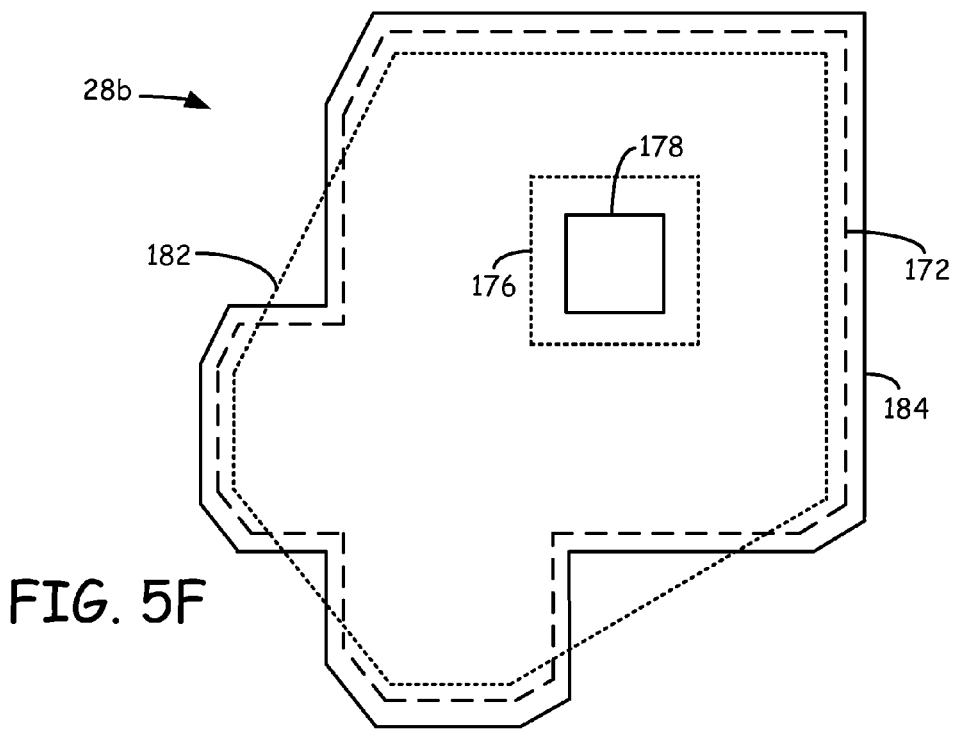
Figure 5G:
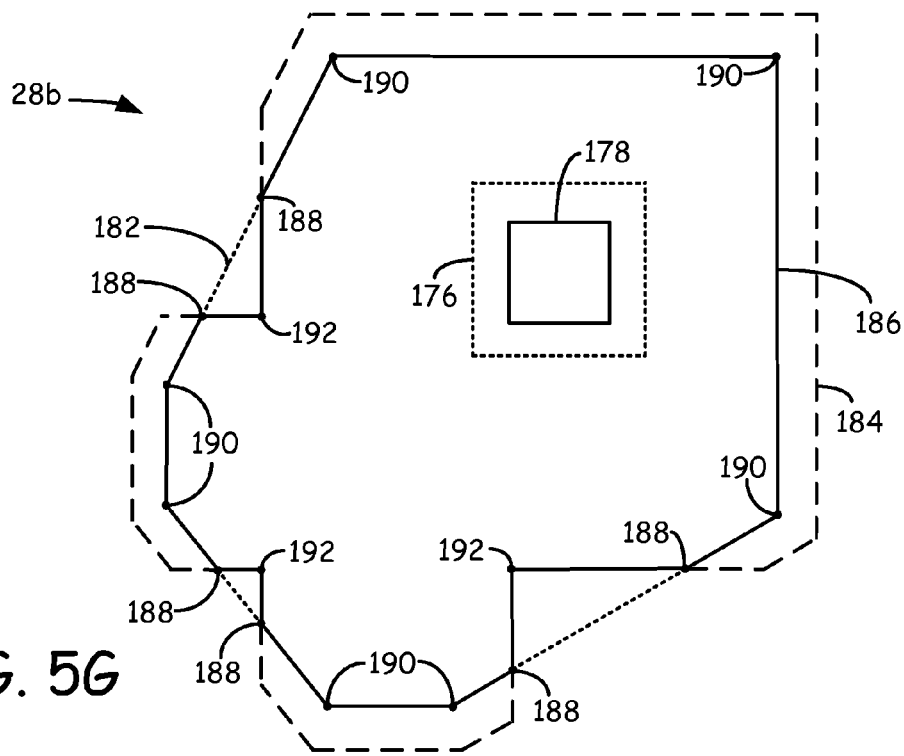

As shown in FIG. 4H, safety zone 76 and offset convex hull 82 may then be discarded to provide the resulting layer 28*a* having the polygons of offset inner boundary 78 and intersection outer boundary 86. Method 54 may then be repeated for each subsequent layer below layer 28*a*, where the initial outer and inner boundary polygons may be generated (pursuant to step 56 of method 54) to support the previous modified layer of support structure 28. For example, as shown in FIG. 5A, layer 28*b* is initially generated to support the resulting layer 28*a* having offset inner boundary 78 and intersection outer boundary 86, as shown in FIG. 4H. Accordingly, as shown in FIGS. 5A-5H, computer 12 may apply method 54 to layer 28*b* following the same process discussed above for layer 28*a*, where the respective reference numbers are increased by "100".

Figure 5H:
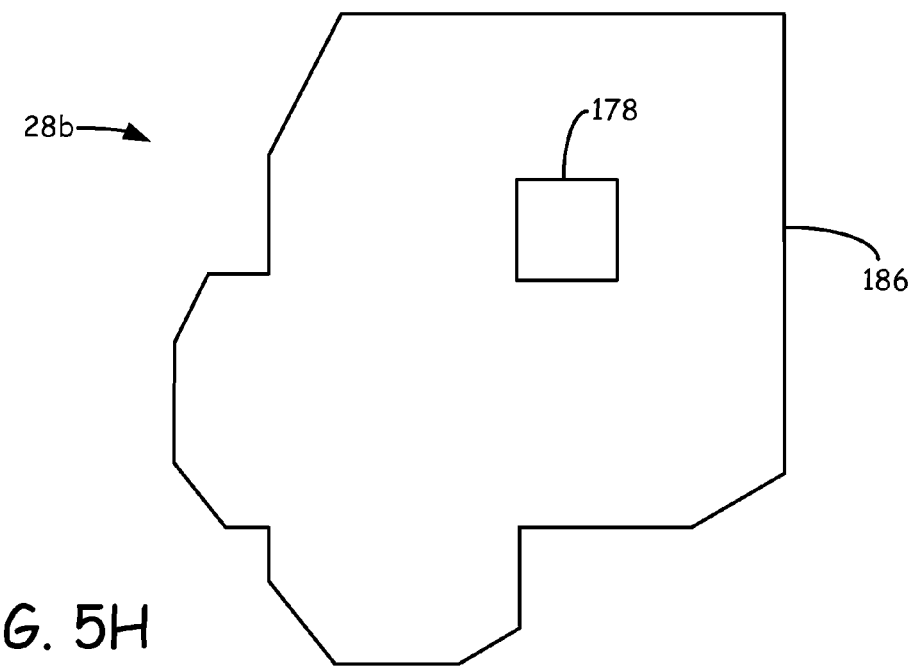
Figure 6A:
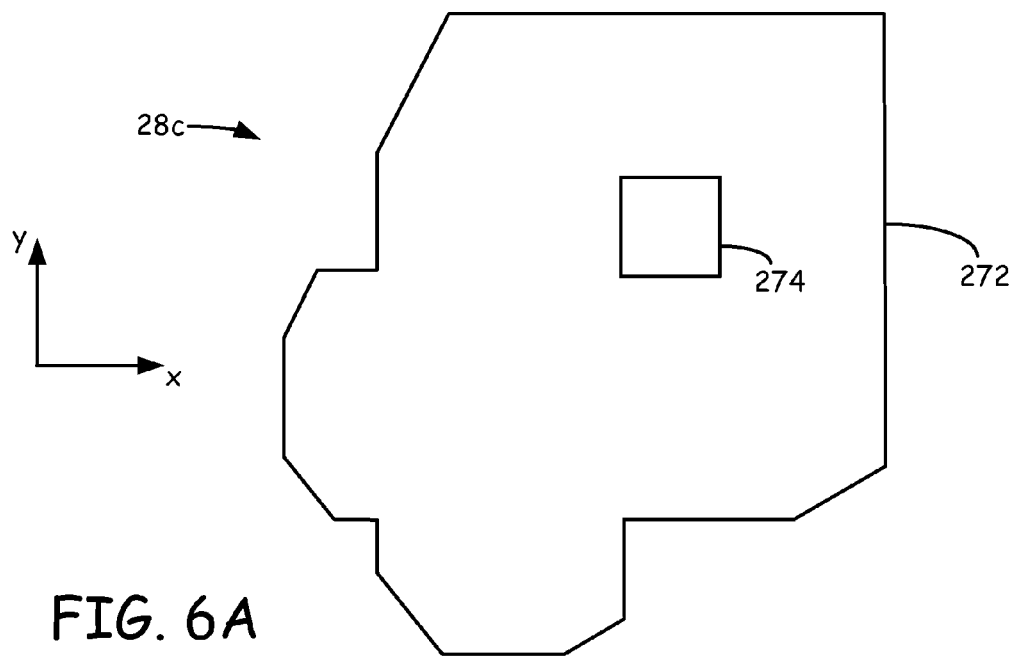
FIGS. 6A-6H are top views of a third layer of the support structure, further illustrating the application of the method shown in FIG. 3, where the third layer is located below the second layer shown in FIGS. 5A-5H.
Figure 6B:
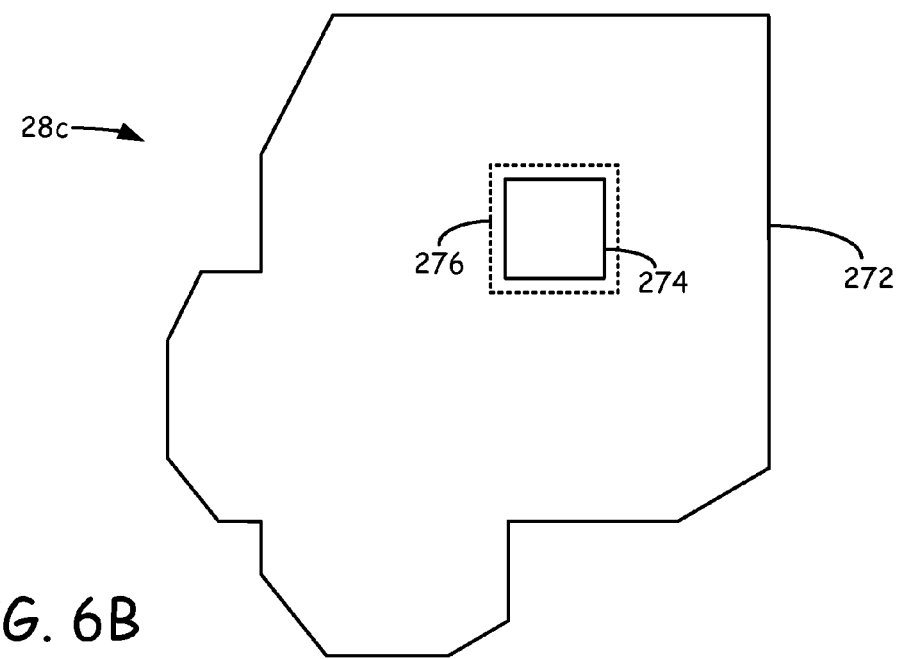
Figure 6C:
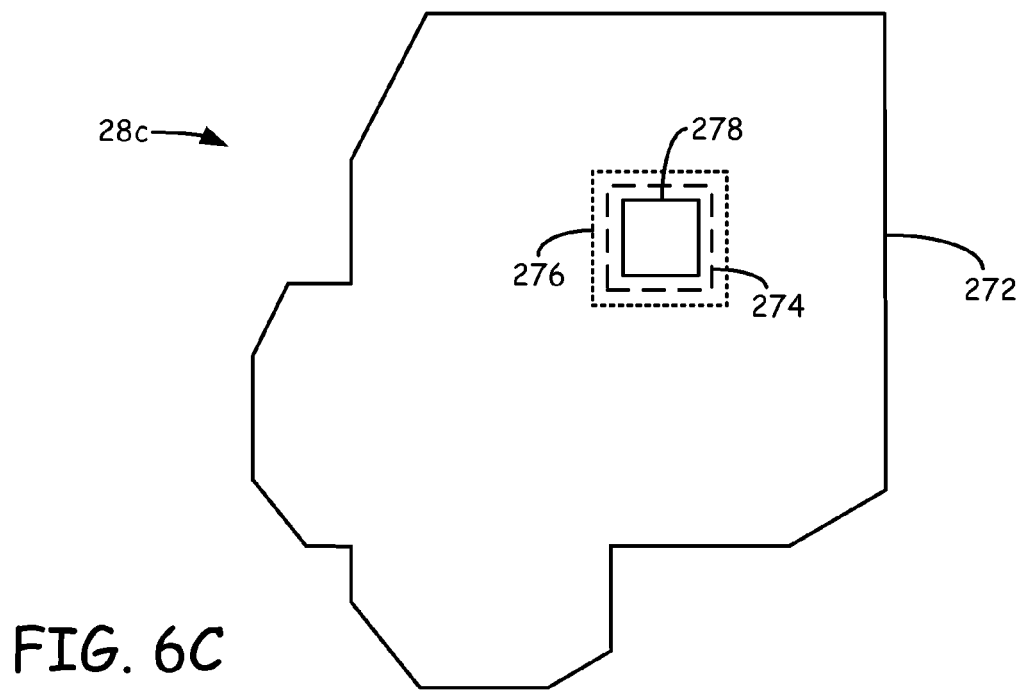
Figure 6D:
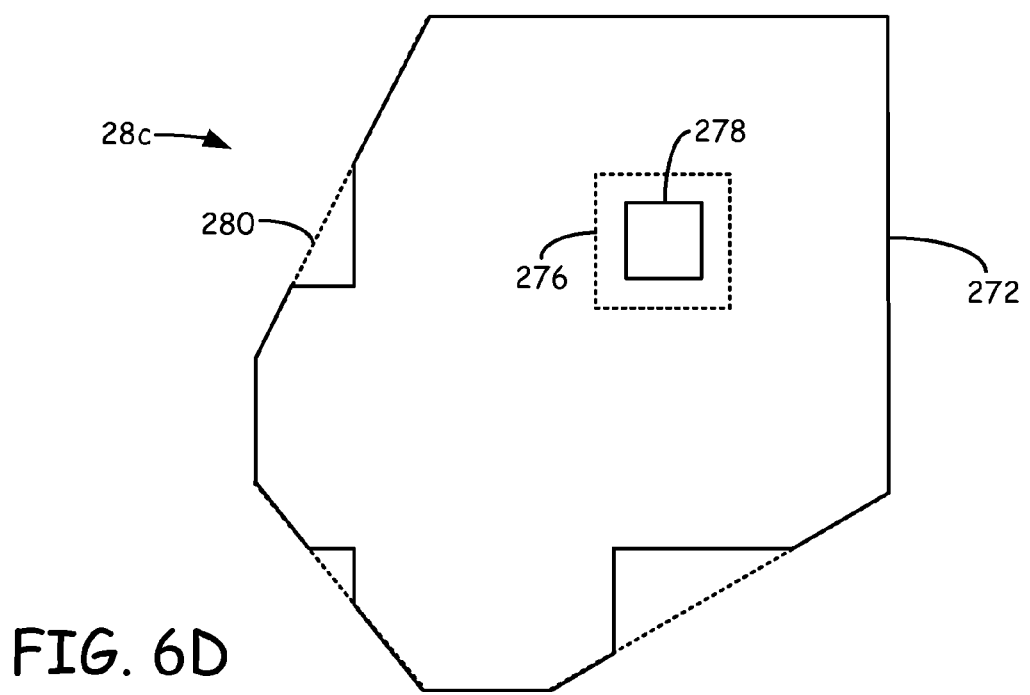
Figure 6E:
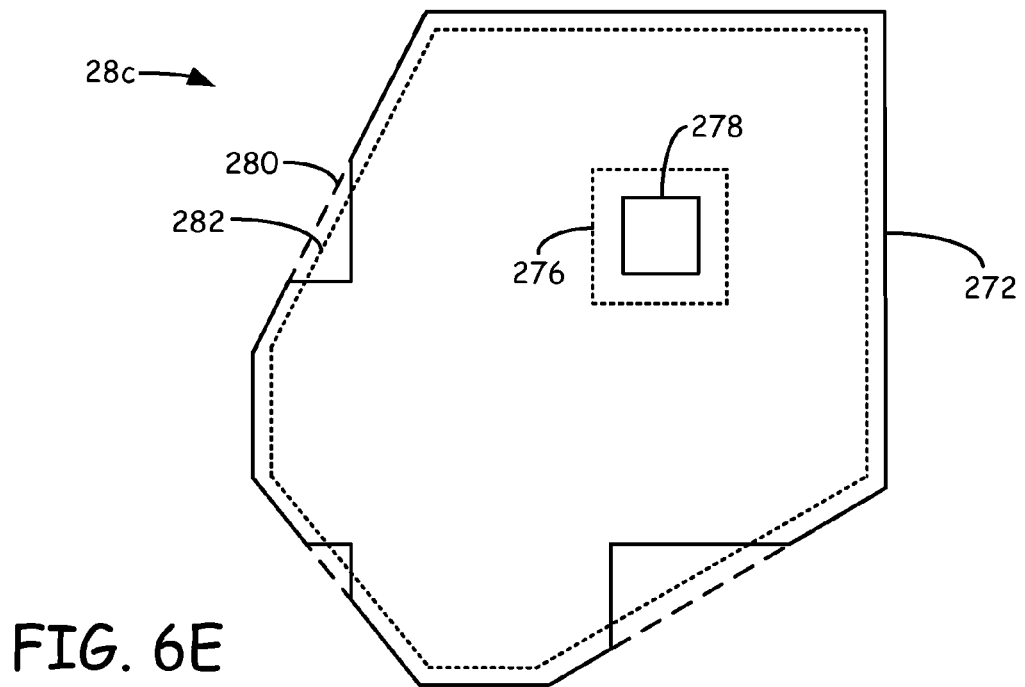
Figure 6F:
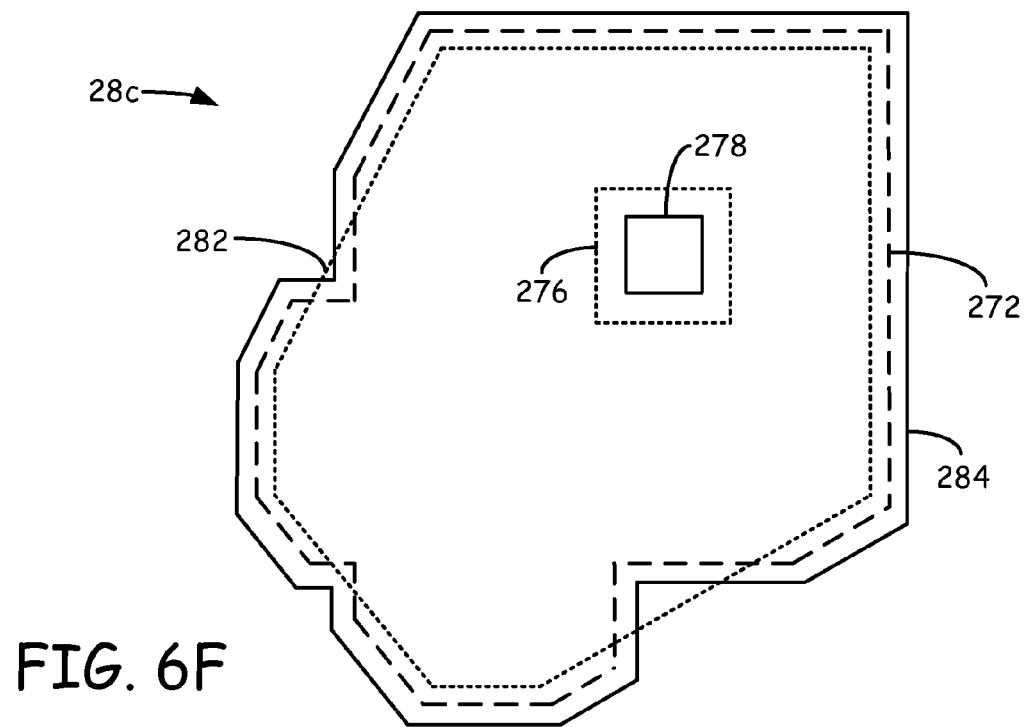
Figure 6G:
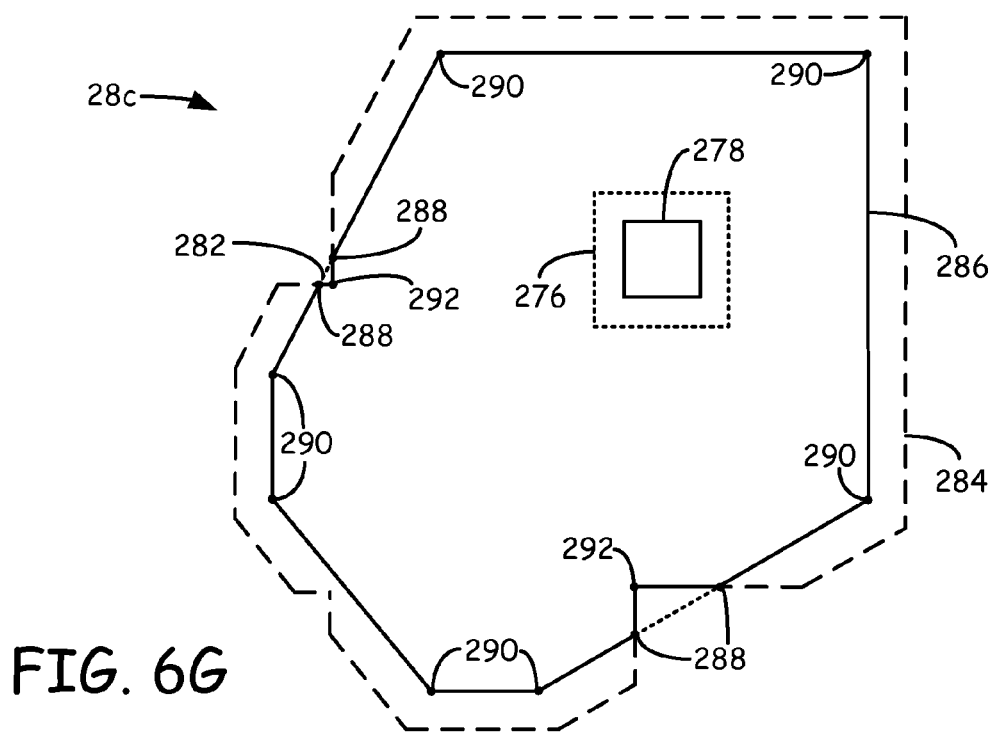
Figure 6H:
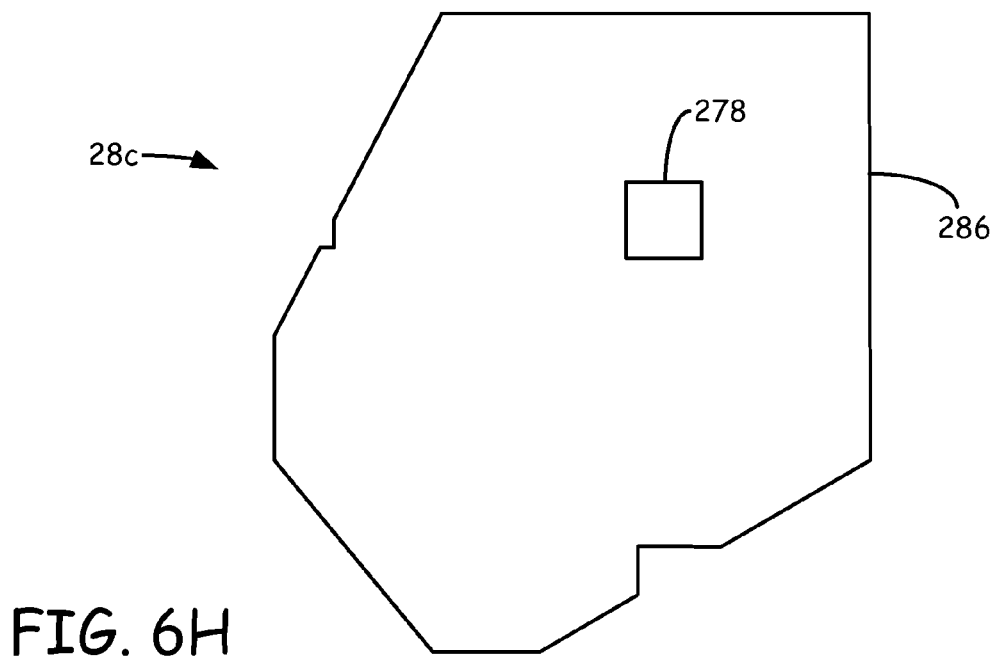

Furthermore, as shown in FIG. 6A, layer 28*c* is initially generated to support the resulting layer 28*b* having offset inner boundary 178 and intersection outer boundary 186, as shown in FIG. 5H. Accordingly, as shown in FIGS. 6A-6H, computer 12 may also apply method 54 to layer 28*c* following the same process discussed above for layer 28*a*, where the respective reference numbers are increased by "200".

A comparison of intersect outer boundaries 86, 186, and 286 illustrates the effects of method 54 on the generation of successive layers of support structure 28. For example, as discussed above, method 54 reduces the area of layers 28*a*-28*c* in the horizontal x-y plane in a downward direction along the vertical z-axis. This reduces the amount of support material required to build support structure 28, and reduces the distance that extrusion head 20 is required to move around the lateral perimeter of a given layer of support structure 28, and as well as lowering the required total angular deflection of extrusion head 20, as discussed above.

Additionally, the interior void in support structure 28, as defined in part by offset inner boundaries 78, 178, and 278, also decreases in a downward direction along the vertical z-axis. This reduces interruptions when bulk filling the interior regions of the support structure (e.g., with a raster fill pattern), which further reduces the overall time required to build support structure 28 with system 10. In one embodiment, computer 12 may also eliminate the inner boundary polygon when the inner boundary polygon eventually becomes too small due to the decrease in its size over successive layers. Computer 12 may continue to apply method 54 to each successive layer of support structure 12 until the last layer is reached (pursuant to step 48 of method 36, shown in FIG. 2). Computer 12 may then transmit the resulting data to system 10 to build 3D model 26 and support structure 28, where support structure 28 includes the outer convex dimensions that reduce in size and complexity in a downward direction along the vertical z-axis.

Although the present disclosure has been described with respect to several embodiments, workers skilled in the art will recognize that changes may be made in form and detail without departing from the spirit and scope of the disclosure.

The invention claimed is:

1. A method for building a support structure with a deposition-based digital manufacturing system, the method comprising:
   (a) providing an outer boundary polygon of a layer of the support structure;
   (b) generating a convex hull polygon based on the outer boundary polygon;
   (c) offsetting the convex hull polygon inward;
   (d) offsetting the outer boundary polygon outward toward the convex hull polygon;
   (e) generating an intersection boundary polygon based at least in part on intersections of the offset boundary polygon and the offset convex hull polygon;
   (f) repeating steps (b)-(e) for a plurality of successively lower layers of the support structure, wherein each generated intersection boundary polygon is provided as the boundary polygon for a next layer of the successively lower layers; and
   (g) building the support structure with the deposition-based digital manufacturing system based in part on tool path data from the generated intersection boundary polygons, wherein the built support structure has convex dimensions that reduce in complexity in a downward direction along a build axis such that the built support structure has a lower volume than that of a bulk support structure having vertical walls.

2. The method of claim 1, wherein building the support structure with the deposition-based digital manufacturing system comprises depositing roads of a support material having a road width, and wherein offsetting the convex hull polygon inward comprises offsetting the convex hull polygon inward by a distance that includes up to about 50% of the road width.

3. The method of claim 1, wherein building the support structure with the deposition-based digital manufacturing system comprises depositing roads of a support material having a road width, and wherein offsetting the boundary polygon outward comprises offsetting the boundary polygon outward by a distance that includes up to about 50% of the road width.

4. The method of claim 1, wherein the layer of the support structure further includes an inner boundary polygon, and wherein the method further comprises offsetting the inner boundary polygon inward.

5. The method of claim 1, wherein the layer of the support structure further includes an inner boundary polygon, and wherein the method further comprises generating a safety zone polygon at a location that is offset outward from the inner boundary polygon.

6. The method of claim 5, and further comprising uniting the generated intersection boundary polygon with the safety zone polygon.

7. The method of claim 1, and further comprising comparing an area of the offset boundary polygon to a threshold denoting a minimum layer area.

8. A method for building a support structure with a deposition-based digital manufacturing system, the method comprising:
  (a) providing vertices defining an outer boundary polygon for a layer of the support structure;
  (b) generating vertices of a convex hull polygon based on the vertices of the boundary polygon;
  (c) offsetting the vertices of the convex hull polygon inward to provide an offset convex hull polygon;
  (d) offsetting the vertices of the outer boundary polygon outward toward the vertices of the convex hull polygon to provide an offset boundary polygon;
  (e) generating an intersection boundary polygon having vertices, wherein at least a portion of the vertices of the intersection boundary polygon are selected from the group consisting of a vertex that is located at an intersection of the offset boundary polygon and the offset convex hull polygon, a vertex of the offset boundary polygon located inside of the offset convex hull polygon, a vertex of the offset convex hull polygon located inside of the offset boundary polygon, and combinations thereof;
  (f) repeating steps (b)-(e) for a plurality of successively lower layers of the support structure, wherein each generated intersection boundary polygon is provided as the boundary polygon for a next layer of the successively lower layers; and
  (g) building the support structure with the deposition-based digital manufacturing system based in part on tool path data from the generated intersection boundary polygons, wherein the built support structure has convex dimensions that reduce in complexity in a downward direction along a build axis and wherein the built support structure has a lower volume than that of a bulk support structure having vertical walls.

9. The method of claim 8, wherein building the support structure with the deposition-based digital manufacturing system comprises depositing roads of a support material having a road width, and wherein the vertices of the convex hull polygon are offset inward by a distance up to about 50% of the road width.

10. The method of claim 8, wherein the boundary polygon is a first boundary polygon, and wherein the method further comprises:
  generating vertices defining a second boundary polygon for the layer of the support structure; and
  offsetting the second boundary polygon inward.

11. The method of claim 8, wherein the boundary polygon is a first boundary polygon, and wherein the method further comprises:
  generating vertices defining a second boundary polygon for the layer of the support structure; and
  generating vertices of a safety zone polygon that are offset outward from the second boundary polygon.

12. The method of claim 11, wherein at least one of the vertices of the intersection boundary polygon is selected from the group consisting of a vertex that is located at an intersection of the offset boundary polygon and the safety zone polygon, a vertex of the safety zone polygon located inside of the offset boundary polygon, and combinations thereof.

13. The method of claim 11, wherein the generated vertices of the safety zone polygon are offset outward from the second boundary polygon by a distance that is based at least in part on a road width used to build the support structure with the deposition-based digital manufacturing system.

14. The method of claim 8, and further comprising generating a tool path based at least in part on the intersection boundary polygon.

15. A method for building a support structure with a deposition-based digital manufacturing system, the method comprising:
  generating a convex hull polygon based on an outer boundary polygon for each of a plurality of successively lower layers of the support structure;
  offsetting the convex hull polygon inward for each of the plurality of successively lower layers;
  offsetting the outer boundary polygon outward toward the convex hull polygon for each of the plurality of successively lower layers;
  generating an intersection boundary polygon for each of the plurality of layers based at least in part on intersections of the offset boundary polygon and the offset convex hull polygon, wherein each generated intersection boundary polygon is provided as the boundary polygon for a next lower layer of the successively lower layers; and
  generating a tool path for each of the successively lower layers based at least in part on the intersection boundary polygon for the layer;
  transmitting the generated tool paths to the deposition-based digital manufacturing system; and
  building the support structure based at least in part on the transmitted tool paths, wherein the support structure has convex dimensions that reduce in complexity in a downward direction along a build axis such that the built support structure has a lower volume than that of a bulk support structure having vertical walls.

16. The method of claim 15, wherein building the support structure with the deposition-based digital manufacturing system comprises depositing roads of a support material having a road width, and wherein the convex hull polygon is offset inward for each of the plurality of layers by a distance that includes up to about 50% of the road width.

17. The method of claim 16, wherein the distance ranges from about 15% of the road width to about 45% of the road width.

18. The method of claim 15, wherein at least one of the layers further includes an inner boundary polygon, and wherein the method further comprises generating a safety zone polygon offset from the inner boundary polygon in an outward direction.

19. The method of claim 18, and further comprising uniting at least one of the offset boundary polygons with the safety zone polygon.

20. The method of claim 15, and further comprising comparing an area of the offset boundary polygon to a threshold denoting a minimum layer area for at least a portion of the layers.

* * * * *